(12) United States Patent
   Barros et al.

(10) Patent No.: US 12,652,983 B2
(45) Date of Patent: Jun. 9, 2026

(54) FLUID DELIVERY MODULE

(71) Applicant: Ichor Systems, Inc., Fremont, CA (US)

(72) Inventors: Philip Ryan Barros, Pleasanton, CA (US); Greg Patrick Mulligan, Milpitas, CA (US); Dustin Tomhave, Sartell, MN (US); Christopher Bryant Davis, Georgetown, TX (US)

(73) Assignee: Ichor Systems, Inc.

( * ) Notice: Subject to any disclaimer, the term of this patent is extended or adjusted under 35 U.S.C. 154(b) by 825 days.

(21) Appl. No.: 17/865,553

(22) Filed: Jul. 15, 2022

(65) Prior Publication Data

US 2023/0029366 A1    Jan. 26, 2023

Related U.S. Application Data

(60) Provisional application No. 63/320,326, filed on Mar. 16, 2022, provisional application No. 63/225,148, filed on Jul. 23, 2021.

(51) Int. Cl.
   B01D 46/42     (2006.01)
   B01D 46/24     (2006.01)
   H10P 72/00     (2026.01)

(52) U.S. Cl.
   CPC ...... H10P 72/0402 (2026.01); B01D 46/2403 (2013.01); B01D 46/4272 (2013.01); B01D 2271/027 (2013.01)

(58) Field of Classification Search
   CPC ......... B01D 46/24; B01D 46/42; H01L 21/67; G01F 15/002; G01F 15/005; G01F 1/36; G01F 1/88
   See application file for complete search history.

(56) References Cited

U.S. PATENT DOCUMENTS

| | | |
|---|---|---|
| 5,605,179 A | 2/1997 | Strong, Jr. et al. |
| 6,520,190 B2 * | 2/2003 | Thompson ............ B08B 9/0321 |
| | | 134/22.12 |
| 7,314,506 B2 | 1/2008 | Vininski et al. |

(Continued)

FOREIGN PATENT DOCUMENTS

| | | |
|---|---|---|
| JP | 3442604 B2 | 9/2003 |
| JP | 2004108535 A | 4/2004 |

(Continued)

OTHER PUBLICATIONS

International Search Report and Written Opinion of PCT/US2022/037269 Issued Oct. 13, 2022.

*Primary Examiner* — Sharon Pregler
(74) *Attorney, Agent, or Firm* — The Belles Group, P.C.

(57) ABSTRACT

Apparatuses for controlling fluid flow are important components for delivering process fluids for semiconductor fabrication. These apparatuses for controlling fluid flow require a variety of fluid flow components which are tightly packaged within the apparatuses for controlling flow. In an effort to improve packaging density, fluid delivery modules preferably incorporate both active and passive components into a single substrate block. This enables increases in packaging density as well as enabling reduced cost through greater simplification of the fluid delivery module. For instance, incorporating a filter to filter incoming fluid with a valve or other component in a single monolithic block avoids the need for separate components which add cost and complexity.

21 Claims, 20 Drawing Sheets

(56) References Cited

U.S. PATENT DOCUMENTS

| | | | |
|---|---|---|---|
| 8,573,247 B2 | 11/2013 | Ushigusa et al. | |
| 10,782,165 B2 * | 9/2020 | Mudd | .................. G01F 15/002 |
| 2018/0216976 A1 | 8/2018 | Mudd et al. | |

FOREIGN PATENT DOCUMENTS

| | | | |
|---|---|---|---|
| JP | 4173519 B2 | 10/2008 | |
| JP | 2010196792 A | 9/2010 | |
| KR | 100352886 B1 | 11/2002 | |

* cited by examiner

FLUID DELIVERY MODULE

CROSS-REFERENCE TO RELATED APPLICATIONS

This application claims the benefit of U.S. Provisional Application 63/320,326, filed Mar. 16, 2022, and U.S. Provisional Application 63/225,148, filed Jul. 23, 2021, which are incorporated herein by reference in their entireties.

BACKGROUND

Flow control has been one of the key technologies in semiconductor chip fabrication. Apparatuses for controlling fluid flow are important for delivering known flow rates of process fluids for semiconductor fabrication and other industrial processes. Such devices are used to measure and accurately control the flow of fluids for a variety of applications. This control relies on apparatuses which are designed for increased packaging density and improved functional performance.

As the technology of chip fabrication has improved, the component size has decreased and packaging requirements have become tighter for the apparatuses for controlling flow. Maintenance and repair of apparatuses for controlling flow increasingly involves integrating components to permit denser packaging of the component parts of the apparatuses for controlling flow. In order to improve the packaging density, cost of the end product, and functional performance of the apparatuses, improved methods and equipment are desired.

BRIEF SUMMARY

The present technology is directed to a fluid delivery module comprising an apparatus for controlling flow. The apparatus for controlling flow includes substrate blocks configured to receive an active flow component and a filter media. Apparatuses for controlling flow have a large number of components which must be assembled without leakage in order to function. In addition, it is beneficial to incorporate a filter into the apparatuses for controlling flow to ensure that any fluid flowing therethrough has a minimum of particles. Such apparatuses may be used in a wide range of processes such as semiconductor chip fabrication, solar panel fabrication, and the like.

In one implementation, the invention is a fluid delivery module. The fluid delivery module has a support structure and a substrate block mounted to the support structure. The substrate block has a monolithic body, a component receiving port formed in the monolithic body. The substrate block further has a first fluid pathway formed in the monolithic body and extending from a first inlet opening to a first outlet opening at the component receiving port. A second fluid pathway is formed in the monolithic body and extends from a second inlet opening at the component receiving port to a second outlet opening. A filter media positioned within the second fluid pathway divides the second fluid pathway into a pre-filter section and a post-filter section. A first active flow component is mounted on the monolithic body of the substrate block at the component receiving port and fluidly coupled to each of the first outlet opening and the second inlet opening.

In another implementation, the invention is a fluid delivery module. The fluid delivery module has a substrate block. The substrate block has a monolithic body, a component receiving port formed in the monolithic body. The substrate block further has a first fluid pathway formed in the monolithic body and extending from a first inlet opening to a first outlet opening at the component receiving port. A second fluid pathway is formed in the monolithic body and extends from a second inlet opening at the component receiving port to a second outlet opening. A filter media is positioned within the second fluid pathway, the filter media dividing the second fluid pathway into a pre-filter section and a post-filter section. A first active flow component is mounted on the monolithic body of the substrate block at the component receiving port and fluidly coupled to each of the first outlet opening and the second inlet opening.

In yet another implementation, the invention is a system for processing semiconductor wafers. The system includes a fluid source and the fluid delivery module disclosed above, the first inlet opening of the fluid delivery module fluidly coupled to the fluid source. The system further includes a process chamber fluidly coupled to the fluid delivery module to receive outgoing fluid from the fluid delivery module.

In an alternate implementation, the invention is a method of manufacturing semiconductor chips. First, one or more semiconductor wafers are supported in a process chamber. Second, fluid is supplied to the process chamber using the fluid delivery module disclosed above. Third, one or more semiconductor wafers are contacted with the fluid to perform a processing step.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein.

Figure 1:
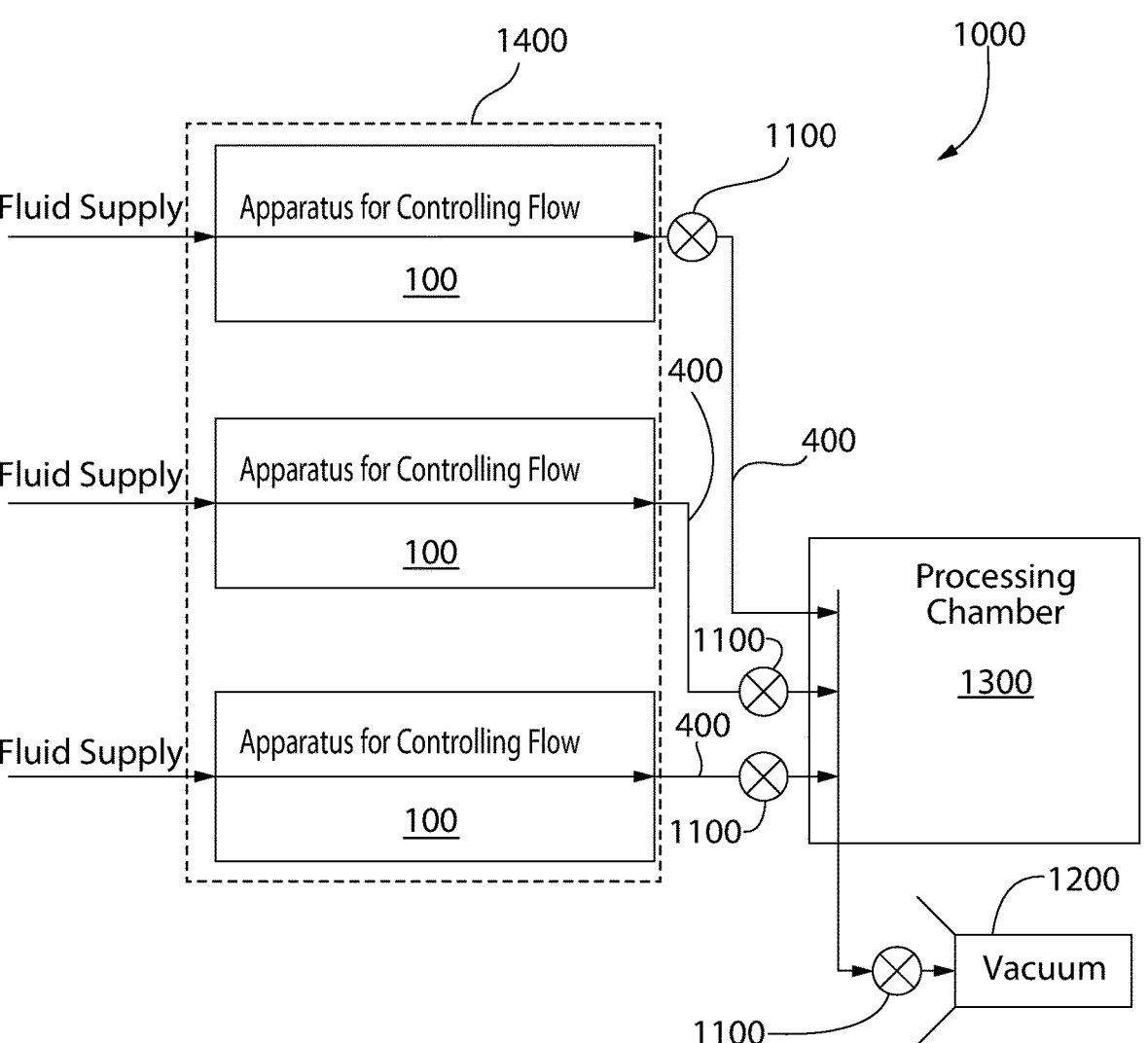
FIG. 1 is a schematic of a system for manufacturing semiconductor devices utilizing one or more apparatuses for controlling flow.

All drawings are schematic and not necessarily to scale. Features shown numbered in certain figures which may appear un-numbered in other figures are the same features unless noted otherwise herein.

DETAILED DESCRIPTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to a seal retainer for use in installing fluid flow components to form a flow control apparatus. Semiconductor fabrication is one industry which demands high performance in control of fluid flows. As semiconductor fabrication techniques have advanced, customers have recognized the need for flow control devices with decreased space requirements. Thus, servicing and maintenance of flow control equipment has grown increasingly difficult as packaging of flow control devices grows denser than ever. The present invention facilitates efficient assembly of a flow control component within a flow control apparatus.

FIG. 1 shows a schematic of an exemplary processing system 1000. The processing system 1000 may utilize a plurality of apparatus for controlling flow 100 fluidly coupled to a processing chamber 1300. The plurality of apparatus for controlling flow 100 are used to supply one or more different process fluids to the processing chamber 1300. Fluids are provided by a plurality of fluid supplies, or fluid sources. Collectively, the plurality of apparatus for controlling flow 100 belong to a fluid delivery module 1400. Optionally, more than one fluid delivery module 1400 may be utilized in the processing system 100. The plurality of apparatus for controlling flow 100 are connected to the processing chamber 1300 by an outlet manifold 400. Articles such as semiconductors and integrated circuits may be processed within the processing chamber 1300.

Valves 1100 isolate each of the apparatus for controlling flow 100 from the processing chamber 1300, enabling each of the apparatus for controlling flow 100 to be selectively connected or isolated from the processing chamber 1300, facilitating a wide variety of different processing steps. The processing chamber 1300 may contain an applicator to apply process fluids delivered by the plurality of apparatus for controlling flow 100, enabling selective or diffuse distribution of the fluids supplied by the plurality of apparatus for controlling flow 100. Optionally, the processing chamber 1300 may be a vacuum chamber or may be a tank or bath for immersing articles in the fluids supplied by the plurality of apparatus for controlling flow 100. A fluid supply line is formed by the flow path from each of the respective fluid supplies to the processing chamber 1300.

In addition, the processing system 1000 may further comprise a vacuum source 1200 which is isolated from the processing chamber 1300 by a valve 1100 to enable evacuation of process fluids or facilitate purging one or more of the apparatus for controlling flow 100. This enables maintenance, switching between process fluids in the same apparatus for controlling flow 100, or other tasks. Optionally, the vacuum source 1200 may be a liquid drain configured to remove liquids from the processing chamber 1300 instead of a vacuum source for removing gases. Optionally, the apparatus for controlling flow 100 may be mass flow controllers, flow splitters, or any other device which controls the flow of a process fluid in a processing system. Furthermore, the valves 1100 may be integrated into the apparatus for controlling flow 100 if so desired. The processing chamber 1300 may house a semiconductor wafer for processing, among other articles.

Processes that may be performed in the processing system 1000 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, electroplating, or any other process utilizing gases or liquids.

Figure 2:
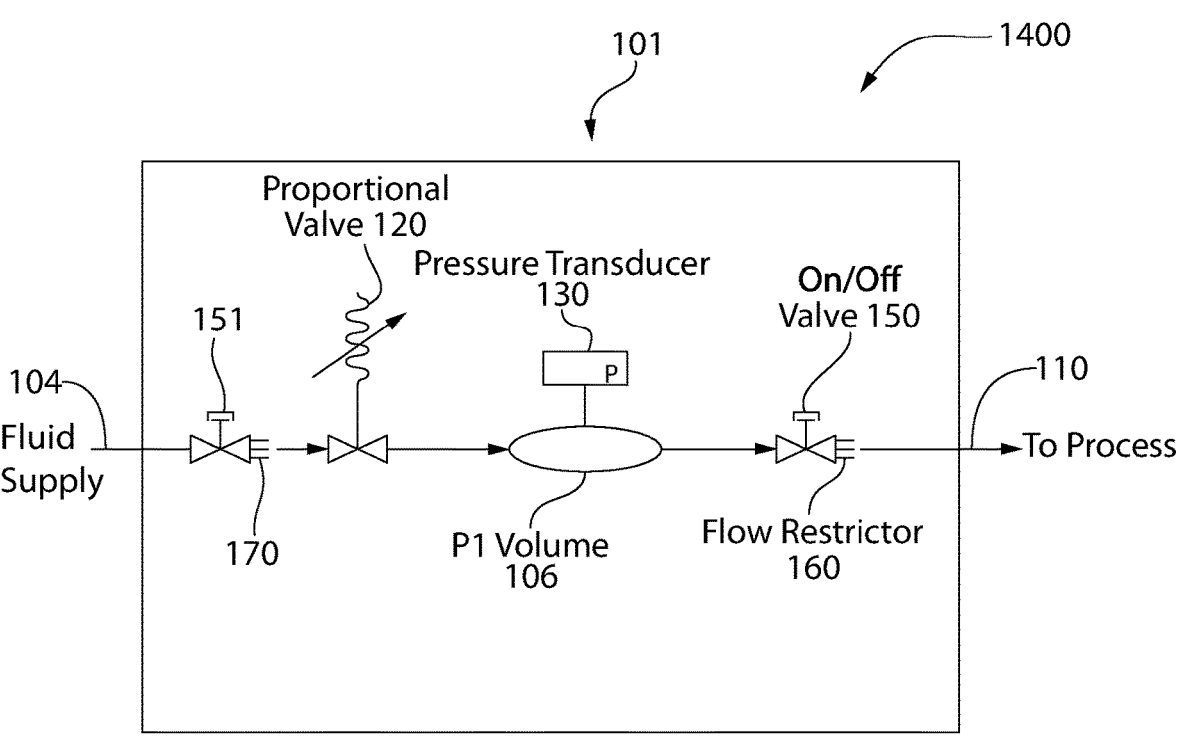
FIG. 2 is a schematic of a fluid delivery module comprising a mass flow controller incorporating a plurality of valve assemblies, the mass flow controller being one of the apparatuses for controlling flow as may be utilized in the process of FIG. 1.

FIG. 2 shows a schematic of an exemplary fluid delivery module 1400 comprising a mass flow controller 101. The mass flow controller 101 is one type of apparatus for controlling flow 100 that may be utilized in the processing system 1000. The mass flow controller 101 has a fluid supply of a process fluid fluidly coupled to an inlet 104. The inlet is fluidly coupled to an inlet control valve 151, which is then coupled to a proportional valve 120. The inlet control valve 151 provides shutoff capability for the mass flow controller 101. Preferably, the inlet control valve 151 is an on/off valve capable of either permitting or preventing flow of a fluid without any intervening states. However, it is conceived that the inlet control valve 151 may be a proportional valve capable of varying flow from an open state to a closed state.

Between the inlet control valve 151 and the proportional valve 120 is a filter media 170. The filter media 170 will be discussed in greater detail below, but serves to filter the incoming fluid from the fluid supply to ensure reliable operation of the apparatus for controlling flow 100, among other purposes. The filter media 170 may be any known filtering material, such as a porous structure, fiber metal structure, woven metal structure, fiber or woven paper or fabric material, foam material, or any other known filtering media. The filter media 170 may be located upstream or down-stream of the inlet control valve 151 with respect to the fluid supply.

The proportional valve 120 is capable of varying the volume of process fluid flowing through the proportional valve 120. The proportional valve 120 meters the mass flow of process fluid which passes to the P1 volume 106. The proportional valve 120 is capable of providing proportional control of the process gas such that it need not be fully open or closed, but instead may have intermediate states to permit control of the mass flow rate of process gas. Similarly, the inlet control valve 151 may also be used to provide proportional control of fluid flow if so desired. In other embodiments, the inlet control valve 151 may be combined with the proportional valve 120. In that configuration, the filter media 170 may be located either upstream or downstream of the inlet control valve 151 and the proportional valve 120 may be omitted.

A P1 volume 106 is fluidly coupled to the proportional valve 120, the P1 volume 106 being the sum of all the volume within the mass flow controller 101 between the proportional valve 120 and a flow restrictor 160. A pressure transducer 130 is fluidly coupled to the P1 volume 106 to enable measurement of the pressure within the P1 volume 106. An on/off valve 150 is located between the flow restrictor 160 and the proportional valve 120 and may be used to completely halt flow of the process gas out of the P1 volume 106. Optionally, the flow restrictor 160 may be located between the on/off valve 150 and the proportional valve 120 in an alternate configuration. Finally, the flow restrictor 160 is fluidly coupled to an outlet 110 of the mass flow controller 101. In the processing system, the outlet 110 is fluidly coupled to a valve 1100 or directly to the processing chamber 1300.

The flow restrictor 160 is used, in combination with the proportional valve 120, to meter flow of the process gas. In most embodiments, the flow restrictor 160 provides a known restriction to fluid flow. The first characterized flow restrictor 160 may be selected to have a specific flow impedance so as to deliver a desired range of mass flow rates of a given process gas. The flow restrictor 160 has a greater resistance to flow than the passages upstream and downstream of the flow restrictor 160.

Optionally, the mass flow controller 101 comprises one or more P2 pressure transducers downstream of the flow restrictor 160 and the on/off valve 150. The P2 pressure transducer is used to measure the pressure differential across the flow restrictor 160. In some embodiments, the P2 pressure downstream of the flow restrictor 160 may be obtained from another apparatus 100 connected to the processing chamber, with the readings communicated to the mass flow controller 101.

Optionally, temperature sensors may be employed to further enhance the accuracy of the mass flow controller 101. They may be mounted in the base of the mass flow controller 101 near the P1 volume 106. Additional temperature sensors may be employed in a variety of locations, including the proportional valve 120, the pressure transducer 130, and the on/off valve 150.

Figure 3:
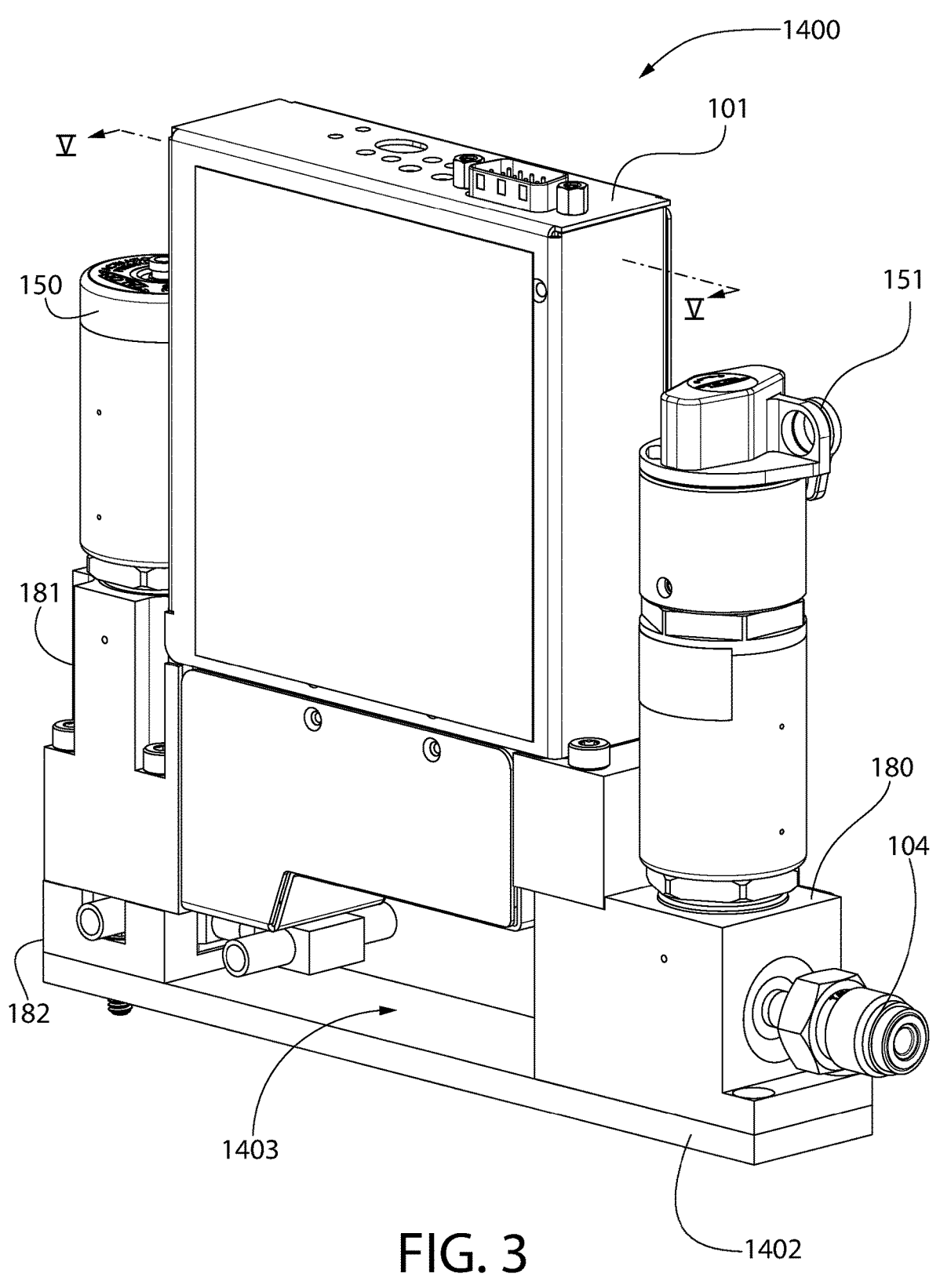
FIG. 3 is a perspective view of the fluid delivery module of FIG. 2.
Figure 4:
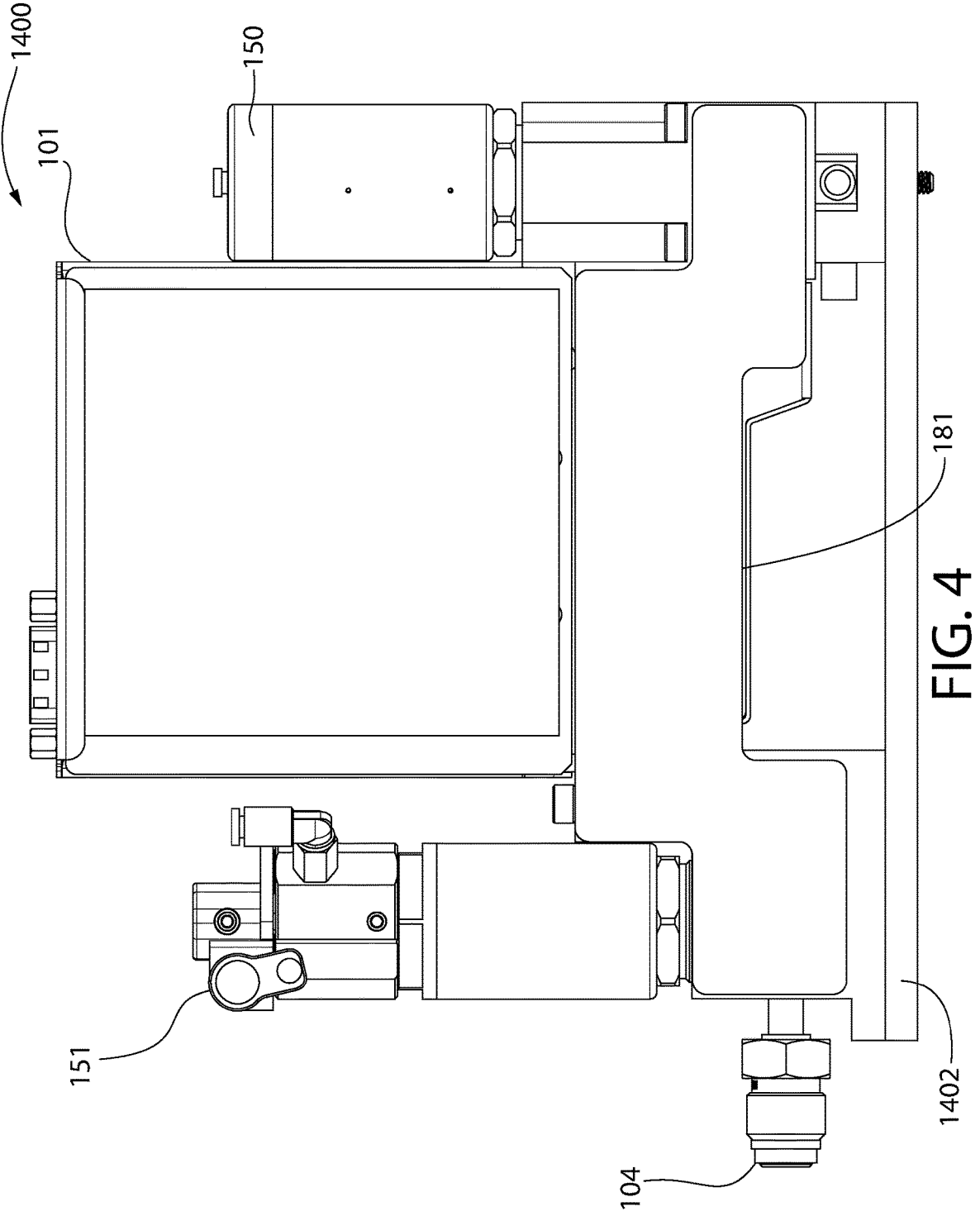
FIG. 4 is a left side view of the fluid delivery module of FIG. 2.
Figure 5:
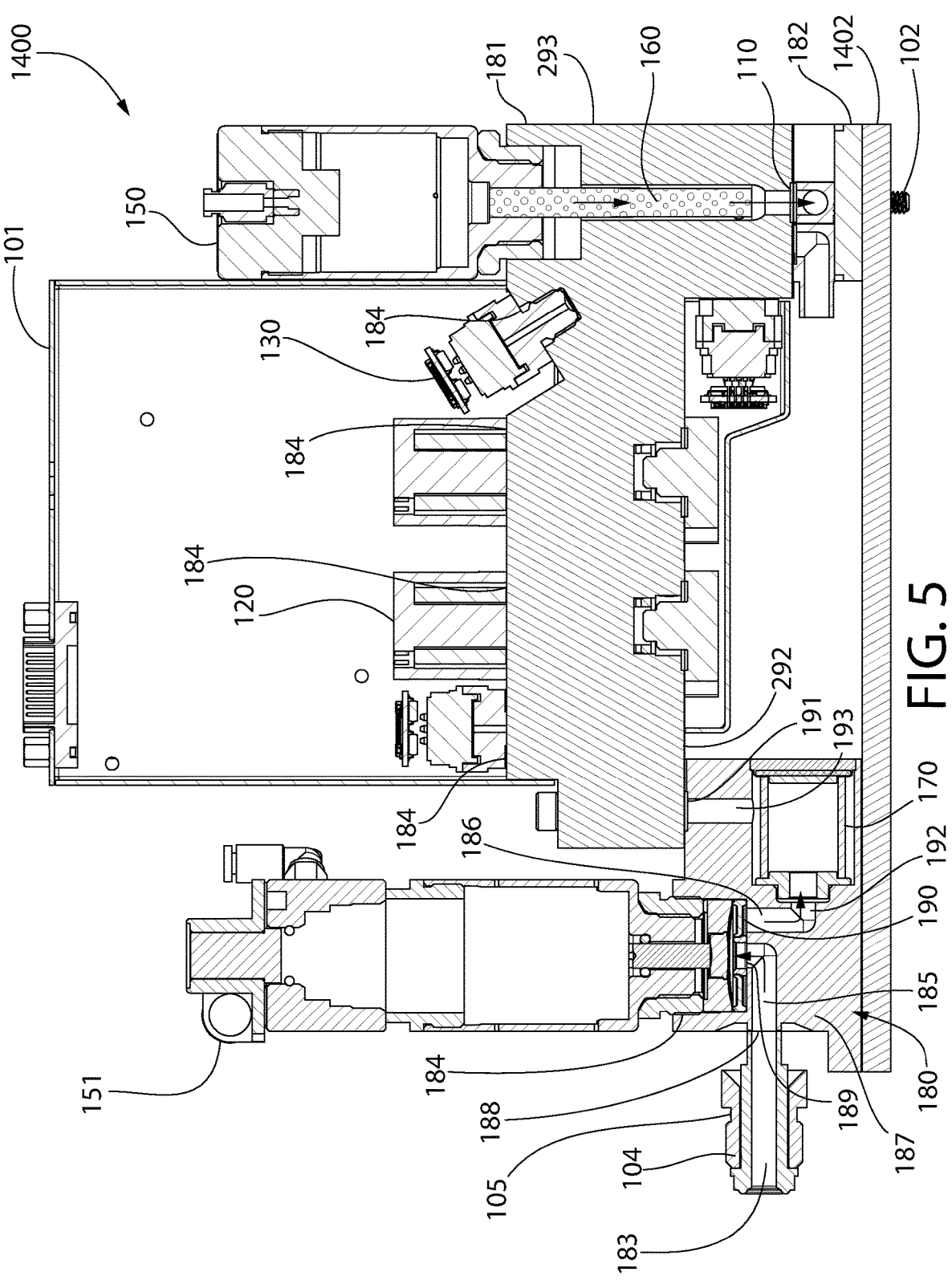
FIG. 5 is a cross-sectional view of the fluid delivery module of FIG. 3, taken along line V-V.
Figure 6:
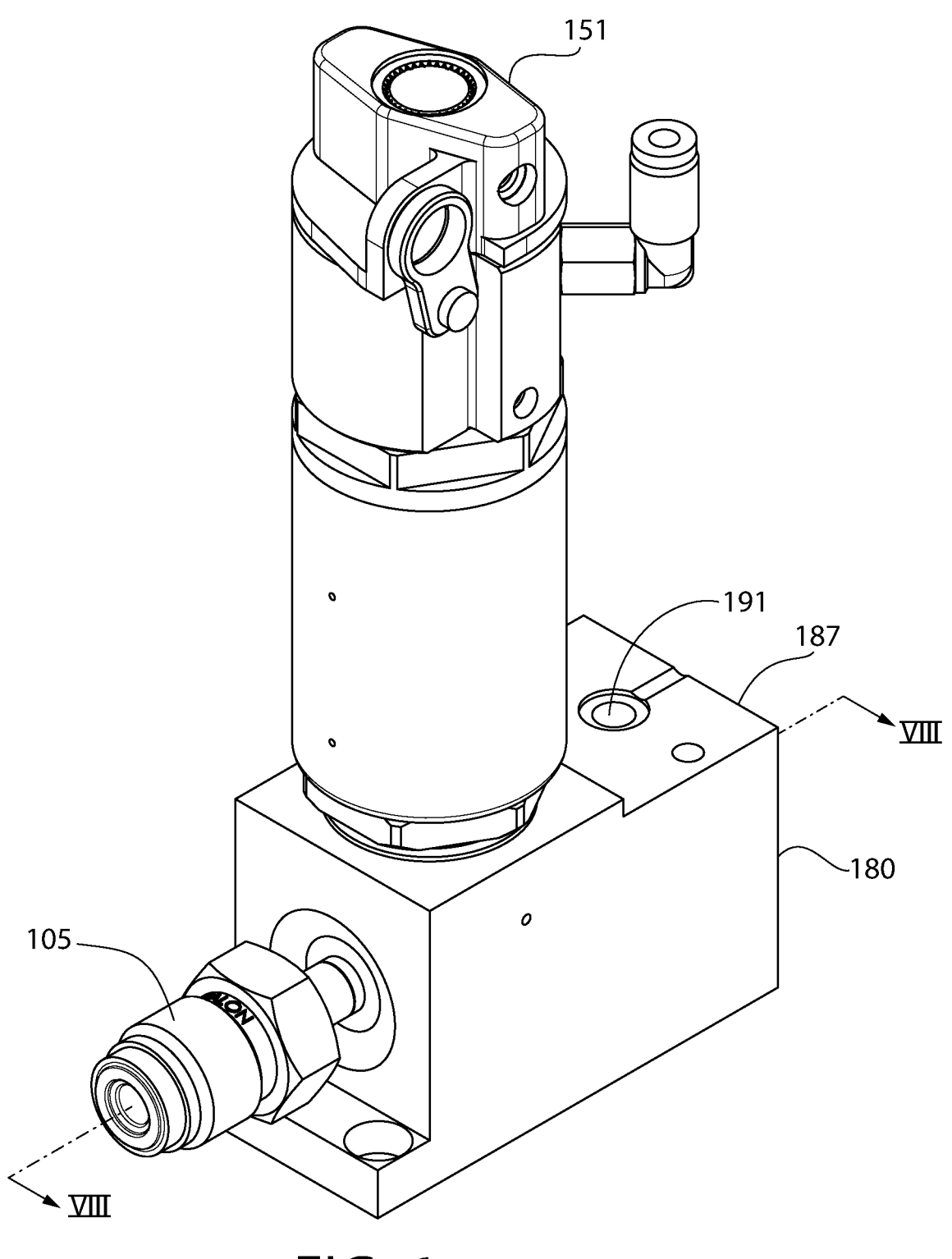
FIG. 6 is a perspective view of a substrate block and an active fluid flow component, the substrate block and active fluid flow component forming a portion of the mass flow controller of FIG. 2.
Figure 7:
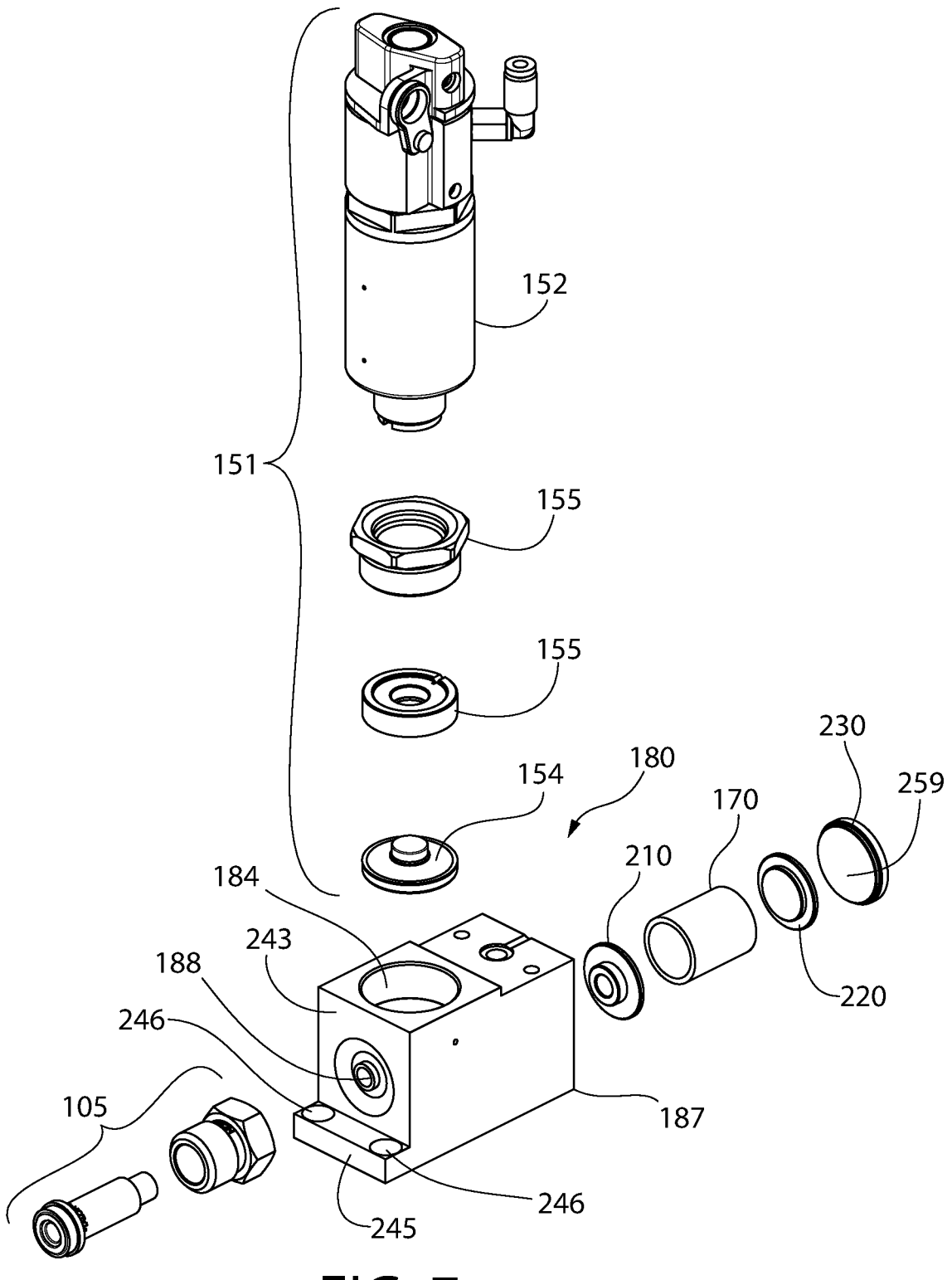
FIG. 7 is an exploded view of the substrate block and active fluid flow component of FIG. 6.
Figure 8:
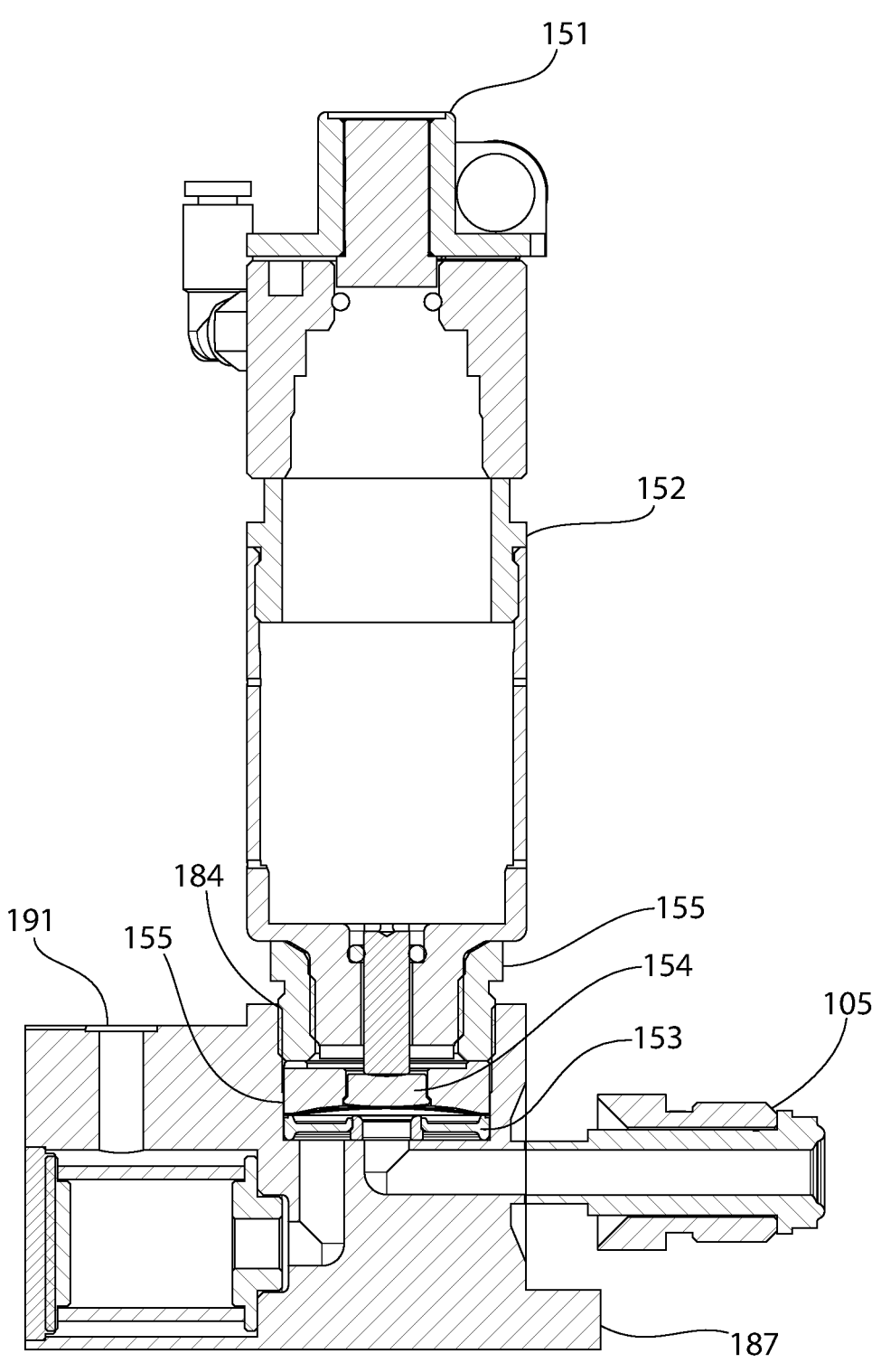
FIG. 8 is a cross-sectional view of the substrate block and active fluid flow component of FIG. 6 taken along the line VIII-VIII.
Figure 9:
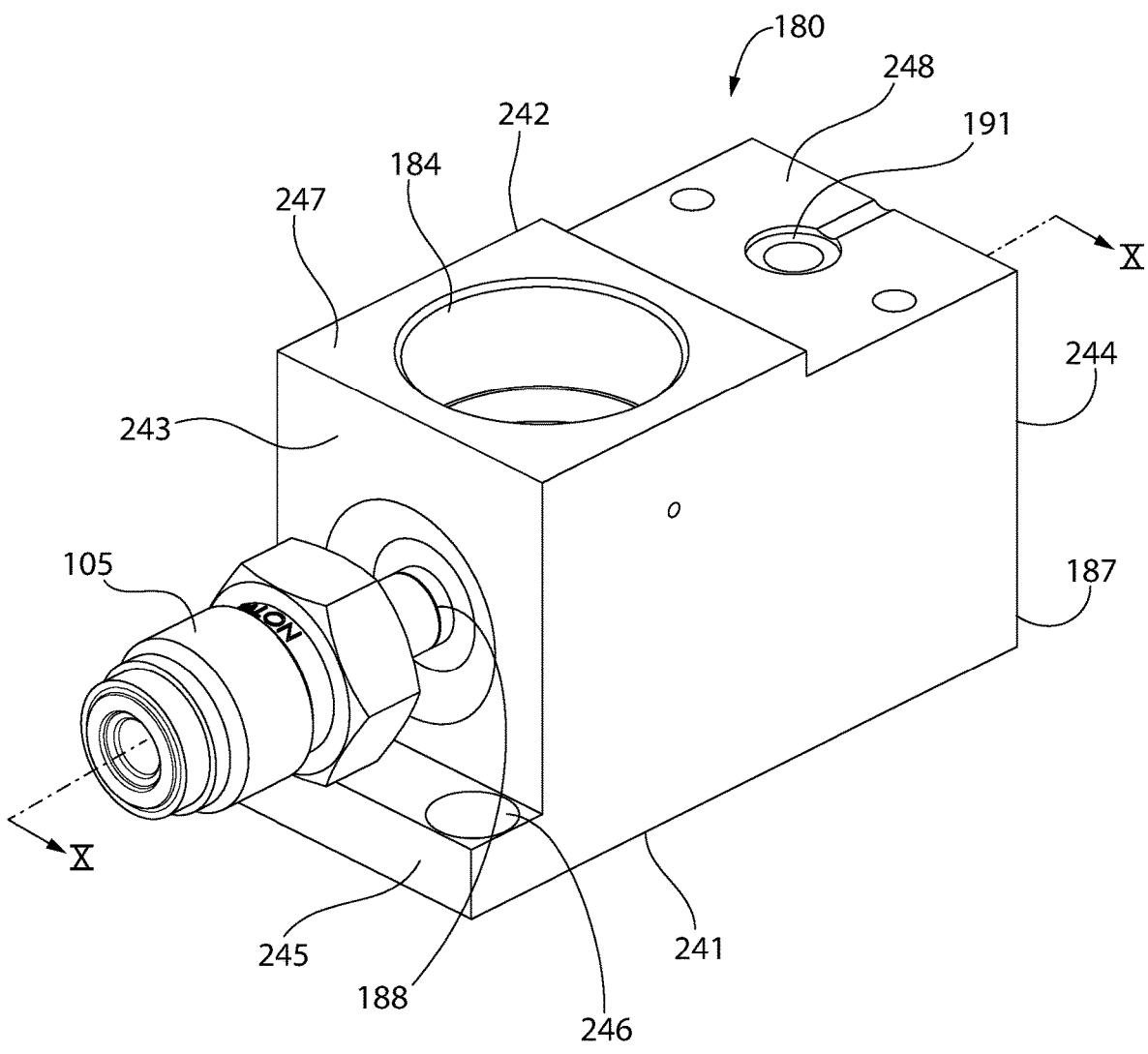
FIG. 9 is a perspective view of the substrate block of FIG. 6.
Figure 10:
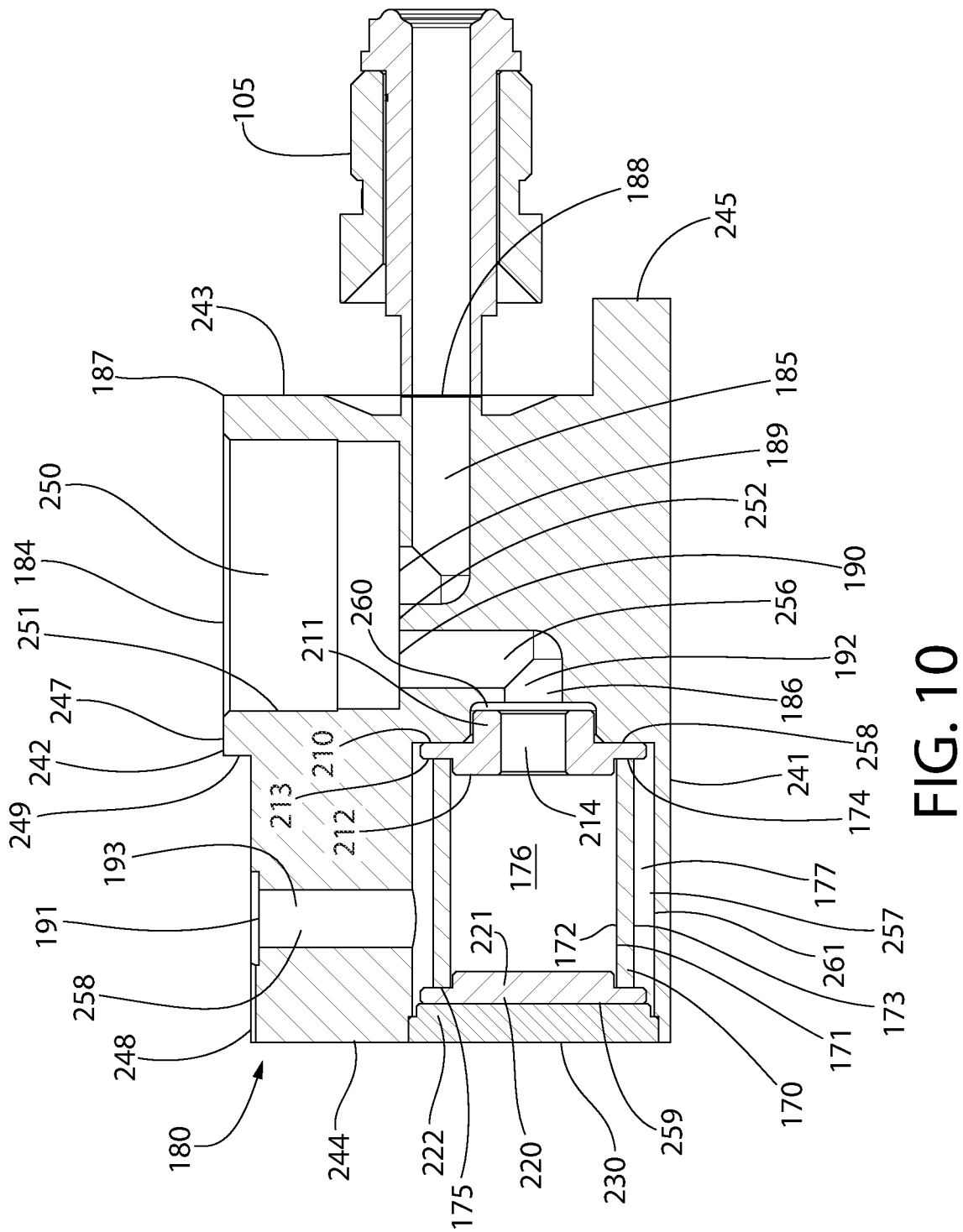
FIG. 10 is a cross-sectional view of the substrate block of FIG. 9 taken along the line X-X.

Turning to FIGS. 3-5, the fluid delivery module 1400 comprising the mass flow controller 101 is shown in greater detail. The fluid delivery module 1400 comprises a support structure 1402. The support structure 1402 may be referred to as a base substrate and is generally a flat plate or sheet with one or more apparatuses for controlling flow 100 mounted thereon. In the present example, the mass flow controller 101 is mounted to the support structure 1402. The support structure 1402 has a top surface 1403 onto which the apparatuses for controlling flow 100 are mounted.

The mass flow controller 101 comprises an inlet 104, an inlet control valve 151, a proportional valve 120, a P1 volume 106, a P1 pressure transducer 130, a valve 150, a flow restrictor 160, and an outlet 110. Fluid flows from the inlet 104 to the outlet 110 as discussed above with respect to FIG. 2. A first substrate block 180, component block 181, and a second substrate block 182 receive the inlet control valve 151, proportional valve 120, P1 pressure transducer 130, valve 150, and flow restrictor 160. A flow path 183 extends from the inlet 104 to the outlet 110.

The first substrate block 180, the inlet control valve 151, and the filter media 170 may be collectively referred to as the first active component assembly 280. The first active component assembly 280 also includes those supporting components required to mount and seal the filter media 170 as will be discussed in detail below. The component block 181, the second substrate block, the proportional valve 120, P1 volume 106, P1 pressure transducer 130, valve 150, and flow restrictor 160 all form a second active flow component assembly 290.

Each of the inlet control valve 151, proportional valve 120, P1 pressure transducer 130, and valve 150 are located at component receiving ports 184. Each of the component receiving ports 184 is configured to receive an active flow component such as the inlet control valve 151, proportional valve 120, P1 pressure transducer 130, and valve 150. The active flow components may include sensors, valves, or other components which actively control or measure flow. The component receiving ports 184 may have a variety of configurations so that some active flow components may only be mounted in certain component receiving ports 184. Thus, the component receiving ports 184 need not all be identical. In other embodiments, the component receiving ports 184 are configured to accept a variety of different active components to permit reconfiguring the apparatus for controlling flow 100.

The first substrate block 180 comprises a monolithic body 187. The monolithic body 187 is an integrally formed, monolithic, component which is formed as a single piece. The monolithic body 187 comprises a component receiving port 184. An inlet fitting 105 forms the inlet 104 and is coupled to the monolithic body 187 by welding, bonding, compression or interference fitting, or any other known means. The monolithic body 187 comprises a first fluid pathway 185 of the fluid flow path 183 extending from a first inlet opening 188 to a first outlet opening 189. The first outlet opening 189 is formed in the component receiving port 184 of the monolithic body 187. A second fluid pathway 186 extends through the monolithic body 187 from a second inlet opening 190 formed in the component receiving port 184 to a second outlet opening 191 formed in the monolithic body 187. The second outlet opening 191 fluidly connects the fluid flow path 183 from the inlet 104 to the component block 181, ensuring that fluid can flow from the inlet 104 to the active components mounted on the component block 181.

As can be seen, the filter media 170 is located within the second fluid pathway 186. The filter media 170 divides the second fluid pathway 186 into a pre-filter section 192 and a post-filter section 193. The inlet control valve 151 is mounted to the component receiving port 184 of the monolithic body 187 and fluidly coupled to each of the first outlet opening 189 and the second inlet opening 190. Thus, the inlet control valve 151 controls flow of fluid from the inlet 104 to the second outlet opening 191. In addition, the filter media 170 filters the fluid to ensure that the other active components receive filtered fluid, improving reliability of the apparatus 100 and ensuring a minimum of contaminants reach the process chamber 1300.

The flow path 183 further comprises fluid pathways (not shown) which conduct fluid from the first substrate block 180 to the outlet 110. The fluid pathways extend through the component block 181 and, optionally, through the second substrate block 182. The component block 181 has a first end portion 292 and a second end portion 293, with the second end portion protruding horizontally beyond the first substrate block 181. The first end portion 292 is coupled to the first substrate block 180 so that the fluid pathways of the second active flow component assembly 290 are fluidly coupled to the second outlet opening 191. Thus, the second fluid pathway 186 of the first substrate block 180 is fluidly coupled to the fluid pathways of the second active flow component assembly 290 via the second outlet opening 191.

The flow path 183 extends from the inlet 104 to the outlet 110 via the first fluid pathway 185, the second fluid pathway 186, and the fluid pathways of the second active flow component assembly 290. The second end portion 293 of the component block 181 is coupled to the second substrate block 182, and the second substrate block 182 is fastened to the top surface 1403 of the support structure 1402, typically via fasteners 102 extending into the support structure 1402. Stated differently, the second end portion 293 of the component block is mounted to the support structure 1402 via the second substrate block 182.

Turning to FIGS. 6-10, the inlet control valve 151 and the first substrate block 180 will be described in greater detail. The inlet control valve 151 comprises a valve body 152, a valve seat, 153, and a closure member 154 in addition to various mounting components 155 required to position and secure the valve body 152, valve seat 153, and closure member 154 and permit operation of the inlet control valve 151. The inlet control valve 151 moves the closure member 154 such that it moves from an open state where it is spaced from the valve seat 153 to a closed state where it is in contact with the valve seat 153. The inlet control valve 151 is directly mounted to the component receiving port 184, with the inlet control valve 151 solely and exclusively supported by the first substrate block 180.

The inlet control valve 151 may be referred to as the first active component. The inlet control valve 151 may be a lock out tag out valve. Such valves are used to ensure safety when equipment is being serviced. In this implementation, the inlet control valve 151 may be locked out with a mechanical lock, ensuring that the inlet control valve 151 remains in the closed state. The inlet control valve 151 may also be tagged so that it is readily apparent to an equipment technician that the inlet control valve 151 is in the closed state. Typically, any device which is locked out and tagged is described generally with the term "lock out tag out." Lock out tag out valves may be referred to as "LOTO" valves.

The first substrate block 180 comprises the inlet fitting 105, which is formed of two separate components as shown. The first substrate block 180 also comprises the monolithic body 187 and the filter media 170 as discussed above. In addition, the first substrate block 180 comprises a first annular gasket 210, a second gasket 220, and an end cap 230.

Turning to the monolithic body 187, the monolithic body has a bottom surface 241, a top surface 242, a first sidewall surface 243, and a second sidewall surface 244. The first inlet opening 188 is formed into the first sidewall surface 243. A flange portion 245 extends horizontally from a bottom of the first sidewall surface 243. A plurality of fasteners extend through the flange portion 245 to join the first substrate block 180 to the support structure 1402. The fasteners secure the bottom surface 241 of the monolithic body 187 to the top surface 1403 of the support structure 1402 and extend through fastener passageways 246 formed in the flange portion 245. Fasteners such as the fasteners 102 discussed above may be utilized. The fasteners 102 may be threaded or may be any other type of fastener suitable for attaching the first substrate block 180 to the support structure 1402.

The top surface 242 comprises a first section 247, and a second section 248. The component receiving port 184 is formed into the first section 247 while the second outlet opening 191 is formed into the second section 248. The first section 247 is vertically offset from the second section 248. The first section 247 is higher than the second section 248. An upstanding wall 249 is located between the first and second sections 247, 248 of the top surface 242. The first and second sections 247, 248 are substantially parallel.

The component receiving port 184 comprises a basin 250, the basin having a basin floor 252 and a collar portion 251 extending from the basin floor 252 to the first section 247 of the top surface 242. The first outlet opening 189 and the second inlet opening 190 are formed into the basin floor 252 of the component receiving port 184. The collar portion 251 forms at least a portion of the component receiving port 184 as noted above, the collar portion 251 being located between the basin floor 252 and the first section 247 of the top surface 242.

Turning to the second fluid pathway 186, the second fluid pathway 186 comprises the pre-filter section 192 and the post-filter section 193 as discussed above. The second fluid pathway 186 comprises a pre-filter passage 256, a filter chamber 257, and a post-filter passage 258. The pre-filter passage 256 extends from the second inlet opening 190 to the filter chamber 257. The post-filter passage 258 extends from the filter chamber 257 to the second outlet opening 191. The filter media 170 is positioned within the filter chamber 257.

The filter chamber 257 is bounded by a pocket formed into the second sidewall surface 244 of the monolithic body 187 and the end cap 230. The filter media 170 is positioned within the filter chamber 257. The filter media 170 comprises a tubular filter body 171, the tubular filter body 171 having an inner surface 172, an outer surface 173, a first edge 174, and a second edge 175. The inner surface 172 of the tubular body defines a central filter cavity 176. A post-filter annulus 177 is formed between the outer surface 173 and an inner surface 261 of the filter chamber 257. Thus, the central filter cavity 176 forms a portion of the pre-filter section 192 while the post-filter annulus 177 forms a portion of the post-filter section 193. The filter media 170 divides the pre-filter section 192 and the post-filter section 193.

The filter media 170 is supported within the filter chamber 257 so that the post-filter annulus 177 is maintained. The post-filter annulus 177 is spaced and isolated from the inner surface 261 so that fluid can pass through the post-filter annulus 177 to the post-filter passage 258. The pre-filter passage 256 is in fluid communication with the central filter cavity 176 while the post-filter annulus 177 is in fluid communication with the post-filter passage 258.

The first annular gasket 210 is positioned within the filter chamber 257 and abuts a first end wall 258 of the filter chamber 257. The second gasket 220 is positioned within the filter chamber 257 and abuts a second end wall 259 of the filter chamber 257. The end cap 230 forms the second end wall 259, the end cap 230 being secured to the monolithic body 187 by welding, gluing, brazing, a threaded or press-fit connection, or any other known means. The end cap 230 encloses the filter chamber 257 so that it is isolated from the ambient environment.

The first annular gasket 210 has a first hub portion 211, second hub portion 212, and a flange portion 213 between and protruding from the first and second hub portions 211, 212. A central passage 214 extends through the first and second hub portions 211, 212. The central passage 214 fluidly couples the pre-filter passage 256 with the central filter cavity 176. The first annular gasket 210 is positioned such that the first hub portion 211 fits within a depression 260 formed in the first end wall 258 of the filter chamber 257. In other words, the first annular gasket 210 is positioned so that the first hub portion 211 nests within the depression 260. The second hub portion 212 extends into the central filter cavity 176, providing positioning of the filter media 171. A first seal is formed between the first end wall 258 and the first edge 174 of the tubular filter body 171. The first seal is formed by compressing the flange portion 213 of the first annular gasket 210 between the first end wall 258 and the first edge 174 of the tubular filter body 171.

The second gasket 220 is positioned within the filter chamber 257. The second gasket 220 comprises a hub portion 221 and a flange portion 222. The second gasket 220 is positioned within the filter chamber 257 such that the flange portion 222 abuts the second end wall 259 of the filter chamber 257. The second edge 175 of the tubular filter body 171 engages the flange portion 222 of the second gasket 220 and the flange portion 222 is in contact with the second end wall 259. The flange portion 222 is compressed between the second edge 175 of the tubular filter body 171 and the second end wall 259 of the filter chamber 257. This forms a second seal between the second edge 175 of the tubular filter body 171 and the second end wall 259 of the filter chamber 257. Thus, the filter media 170 is under compression within the filter chamber 257 and is sealed at the first edge 174 and the second edge 175 by virtue of the first annular gasket 210 and the second gasket 210. The hub portion 221 extends into the central filter cavity 176 and provides positioning for the filter media 170.

Figure 11:
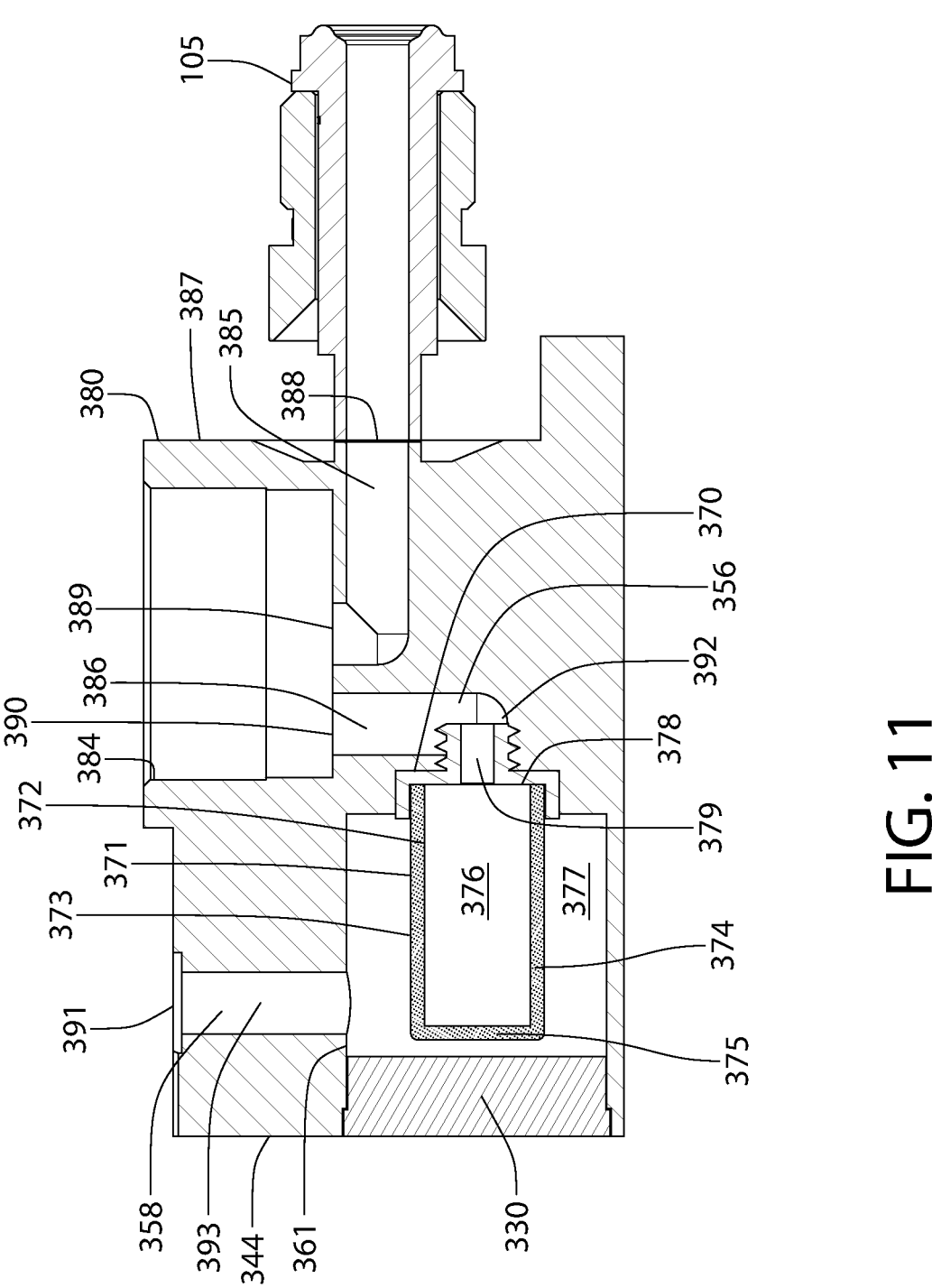
FIG. 11 is a schematic cross-sectional view of an alternate embodiment of the substrate block of FIG. 9 taken along the line X-X.

Turning to FIG. 11, an alternate embodiment of a first substrate block 380 and filter media 370 are illustrated. In the present embodiment, the filter media 370 is configured as a cup filter rather than a cylindrical filter. The first substrate block 380 is identical to the first substrate block 180 with the exception of changes to accommodate the filter media 370. Once again, the first substrate block 380 comprises a monolithic body 387, the filter media 370, an end cap 330, and the inlet fitting 105, the inlet fitting 105 coupled to the monolithic body 387 by welding, bonding, compression or interference fitting, or any other known means. The monolithic body 387 is an integrally formed, monolithic, component which is formed as a single piece. The monolithic body 387 comprises a component receiving port 384 to receive a fluid flow component such as the inlet control valve 151.

The monolithic body 387 further comprises a first fluid pathway 385 of the fluid flow path 183 extending from a first inlet opening 388 to a first outlet opening 389. The first outlet opening 389 is formed in the component receiving port 384 of the monolithic body 387. A second fluid pathway 386 extends through the monolithic body 387 from a second inlet opening 390 formed in the component receiving port 384 to a second outlet opening 391 formed in the monolithic body 387. The second outlet opening 391 fluidly connects the fluid flow path 183 from the inlet 104 to the component block 181, ensuring that fluid can flow from the inlet 104 to the active components mounted on the component block 181.

As can be seen, the filter media 370 is located within the second fluid pathway 386. The filter media 370 divides the second fluid pathway 386 into a pre-filter section 392 and a post-filter section 393. The inlet control valve 151 is mounted to the component receiving port 384 of the monolithic body 387 and fluidly coupled to each of the first outlet opening 389 and the second inlet opening 390. Thus, the inlet control valve 151 controls flow of fluid from the inlet 104 to the second outlet opening 391. In addition, the filter media 370 filters the fluid to ensure that the other active components receive filtered fluid, improving reliability of the apparatus 100 and ensuring a minimum of contaminants reach the process chamber 1300.

Discussing the second fluid pathway 386 in greater detail, the second fluid pathway 386 comprises the pre-filter section 392 and the post-filter section 393 as discussed above. The second fluid pathway 386 comprises a pre-filter passage 356, a filter chamber 357, and a post-filter passage 358. The pre-filter passage 356 extends from the second inlet opening 390 to the filter chamber 357. The post-filter passage 358 extends from the filter chamber 357 to the second outlet opening 391. The filter media 370 is positioned within the filter chamber 357.

The filter chamber 357 is bounded by a pocket formed into a second sidewall surface 344 of the monolithic body 387 and the end cap 330. The filter media 370 is positioned within the filter chamber 357. The filter media 370 comprises a cup-shaped filter body 371, the filter body 371 having an inner surface 372, an outer surface 373, a cylindrical portion 374, a first end portion 375, and a second end portion 378. The inner surface 372 of the filter body 371 defines a central filter cavity 376. A post-filter annulus 377 is formed between the outer surface 373 and an inner surface 361 of the filter chamber 357. Thus, the central filter cavity 376 forms a portion of the pre-filter section 392 while the post-filter annulus 377 forms a portion of the post-filter section 393. The filter media 370 divides the pre-filter section 392 and the post-filter section 393.

The filter media 370 is supported within the filter chamber 357 by the second end portion 378 so that the post-filter annulus 377 is maintained. The post-filter annulus 377 is spaced and isolated from the inner surface 361 so that fluid can pass through the post-filter annulus 377 to the post-filter passage 358. The pre-filter passage 356 is in fluid communication with the central filter cavity 376 while the post-filter annulus 377 is in fluid communication with the post-filter passage 358. In addition, the first end portion 375 is spaced and isolated from the end cap 330, maximizing the area for fluid flow through the filter media 370.

The second end portion 378 is formed of a solid material that is non-permeable to fluid and has an aperture 379 arranged therethrough. The second end portion 378 engages the inner surface 361 of the filter chamber 357 such that the aperture 379 and the second fluid pathway 386 is aligned with the aperture 379 to permit passage of fluid therethrough. The second end portion 378 may incorporate a threaded portion to engage the monolithic body 387, or it may be pressed, welded, bonded, or otherwise attached in any known means to secure the filter media 370 within the filter chamber 357.

Figure 12:
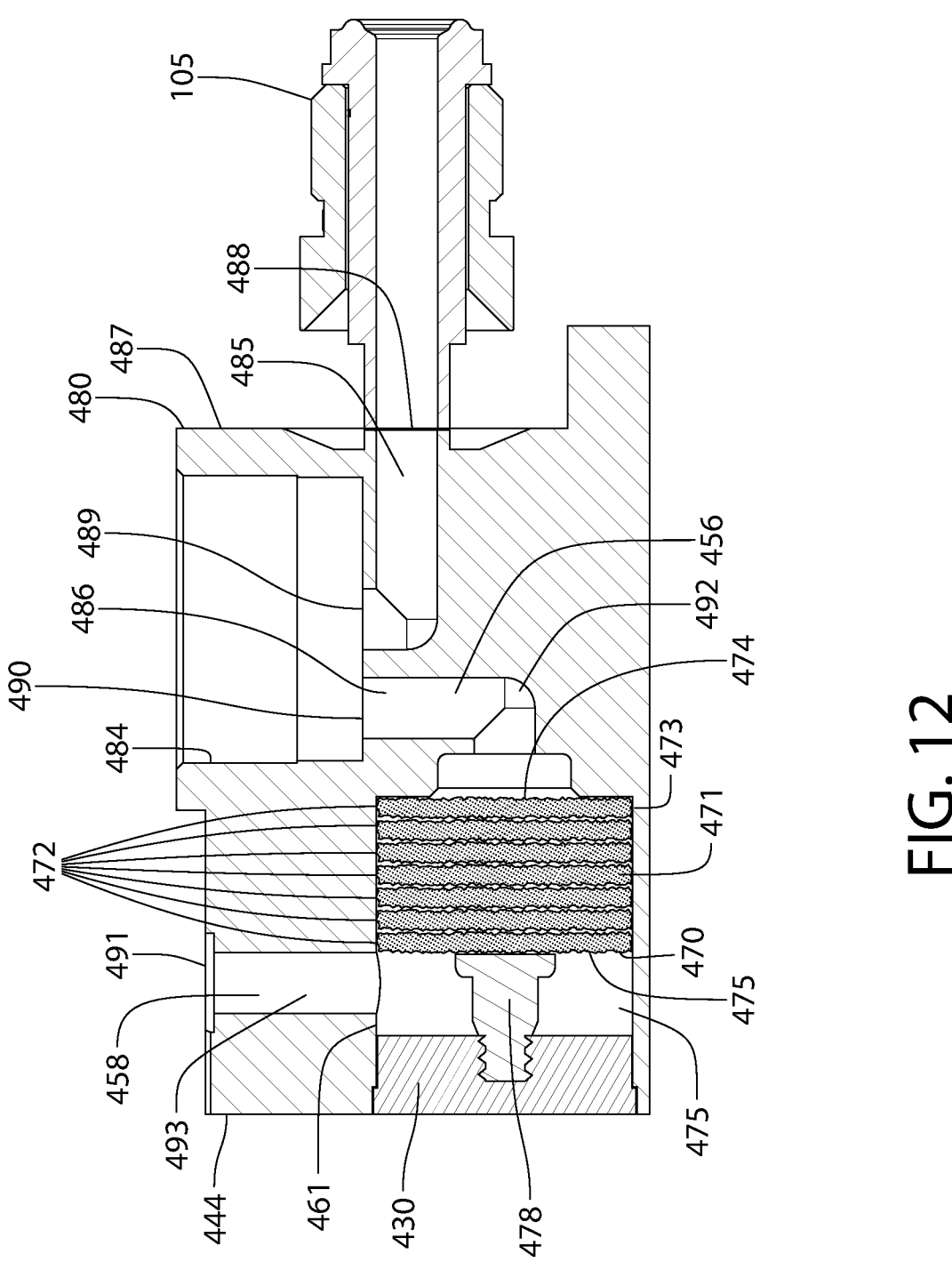
FIG. 12 is a schematic cross-sectional view of an alternate embodiment of the substrate block of FIG. 9 taken along the line X-X.

Turning to FIG. 12, yet another embodiment of a first substrate block 480 and filter media 470 are illustrated. In the present embodiment, the filter media 470 is configured as a disc filter comprising a plurality of stacked discs. The substrate block 480 is identical to the substrate block 180 with the exception of changes to accommodate the filter media 470. Once again, the first substrate block 480 comprises a monolithic body 487, the filter media 470, an end cap 430, and the inlet fitting 105, the inlet fitting 105 coupled to the monolithic body 487 by welding, bonding, compression or interference fitting, or any other known means. The monolithic body 487 is an integrally formed, monolithic, component which is formed as a single piece. The monolithic body 487 comprises a component receiving port 484 to receive a fluid flow component such as the inlet control valve 151.

The monolithic body 487 further comprises a first fluid pathway 485 of the fluid flow path 183 extending from a first inlet opening 488 to a first outlet opening 489. The first outlet opening 489 is formed in the component receiving port 484 of the monolithic body 487. A second fluid pathway 486 extends through the monolithic body 487 from a second inlet opening 490 formed in the component receiving port 484 to a second outlet opening 491 formed in the monolithic body 487. The second outlet opening 491 fluidly connects the fluid flow path 183 from the inlet 104 to the component block 181, ensuring that fluid can flow from the inlet 104 to the active components mounted on the component block 181.

As can be seen, the filter media 470 is located within the second fluid pathway 486. The filter media 470 divides the second fluid pathway 486 into a pre-filter section 492 and a post-filter section 493. The inlet control valve 151 is mounted to the component receiving port 484 of the monolithic body 487 and fluidly coupled to each of the first outlet opening 489 and the second inlet opening 490. Thus, the inlet control valve 151 controls flow of fluid from the inlet 104 to the second outlet opening 491. In addition, the filter media 470 filters the fluid to ensure that the other active components receive filtered fluid, improving reliability of the apparatus 100 and ensuring a minimum of contaminants reach the process chamber 1300.

Discussing the second fluid pathway 486 in greater detail, the second fluid pathway 486 comprises the pre-filter section 492 and the post-filter section 493 as discussed above. The second fluid pathway 486 comprises a pre-filter passage 456, a filter chamber 457, and a post-filter passage 458. The pre-filter passage 456 extends from the second inlet opening 490 to the filter chamber 457. The post-filter passage 458 extends from the filter chamber 457 to the second outlet opening 491. The filter media 470 is positioned within the filter chamber 457.

The filter chamber 457 is bounded by a pocket formed into a second sidewall surface 444 of the monolithic body 487 and the end cap 430. The filter media 470 is positioned within the filter chamber 457. The filter media 470 comprises a disc-shaped filter body 471, the filter body 471 having a plurality of filter discs 472, an outer surface 473, a first end 474, a second end 475, and a retention portion 478. The filter discs 472 may be formed of a porous or woven material to permit fluid to flow axially along the filter body 471 from the first end 474 to the second end 475. Alternately, a passage may be formed through a center of the filter discs 472 and fluid may flow through the passage, then radially outward between the filter discs 472, then flow between the outer surface 473 and an inner surface 461 of the filter chamber 457. In either configuration, the filter media 470 is installed within the filter chamber 457 such that fluid must flow through the filter media 470 to exit the filter chamber 457. In the present configuration, the first end 474 defines the end of the pre-filter section 492 while the second end 475 defines the beginning of the post-filter section 393. Thus, the filter media 470 divides the pre-filter section 492 and the post-filter section 493.

The filter media 470 is supported within the filter chamber 457 by the retention portion 478 so that the filter media 470 is maintained in position with the filter chamber 457. The retention portion incorporates threads which engage corresponding threads in the end cap 430. In alternate embodiments, the retention portion 478 may omit the threads and simply abut the end cap 430 or be omitted. The filter media 470 may be retained by press-fit, adhesive, or other means. In yet other embodiments, the retention portion 478 may be omitted and retention features may be incorporated into the end cap 430. The retention portion 478 retains the filter media in position within the filter chamber 457 so that fluid can pass through the filter media 470 to the post-filter passage 458. The pre-filter passage 456 is in fluid communication with the first end 474 while the second end 475 is in fluid communication with the post-filter passage 458. As can be seen, the second end 475 is spaced and isolated from the end cap 430, maximizing the area for fluid flow through the filter media 470.

Figure 13:
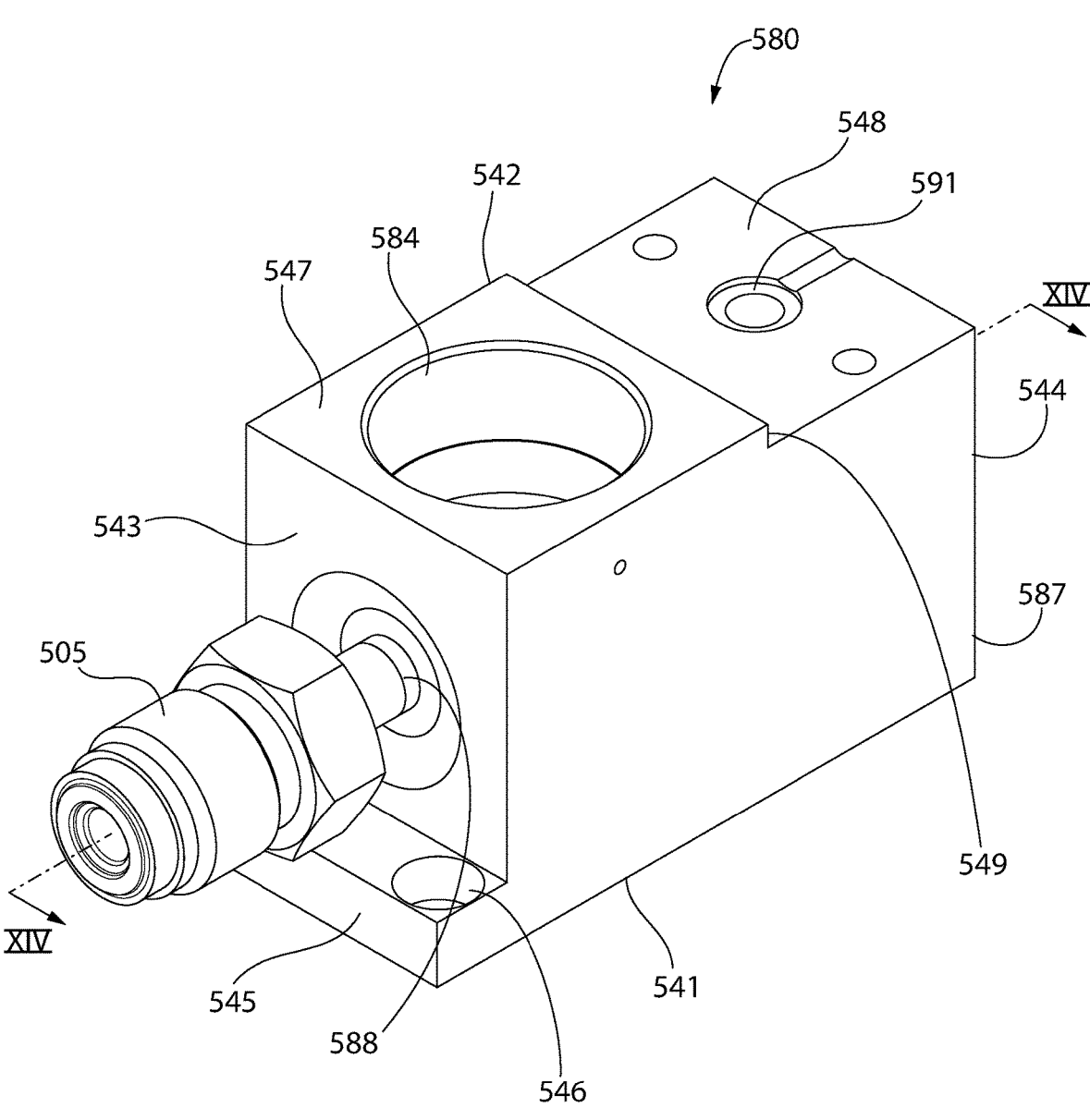
FIG. 13 is a perspective view of another embodiment of a substrate block as may be utilized in an active fluid flow component.
Figure 14:
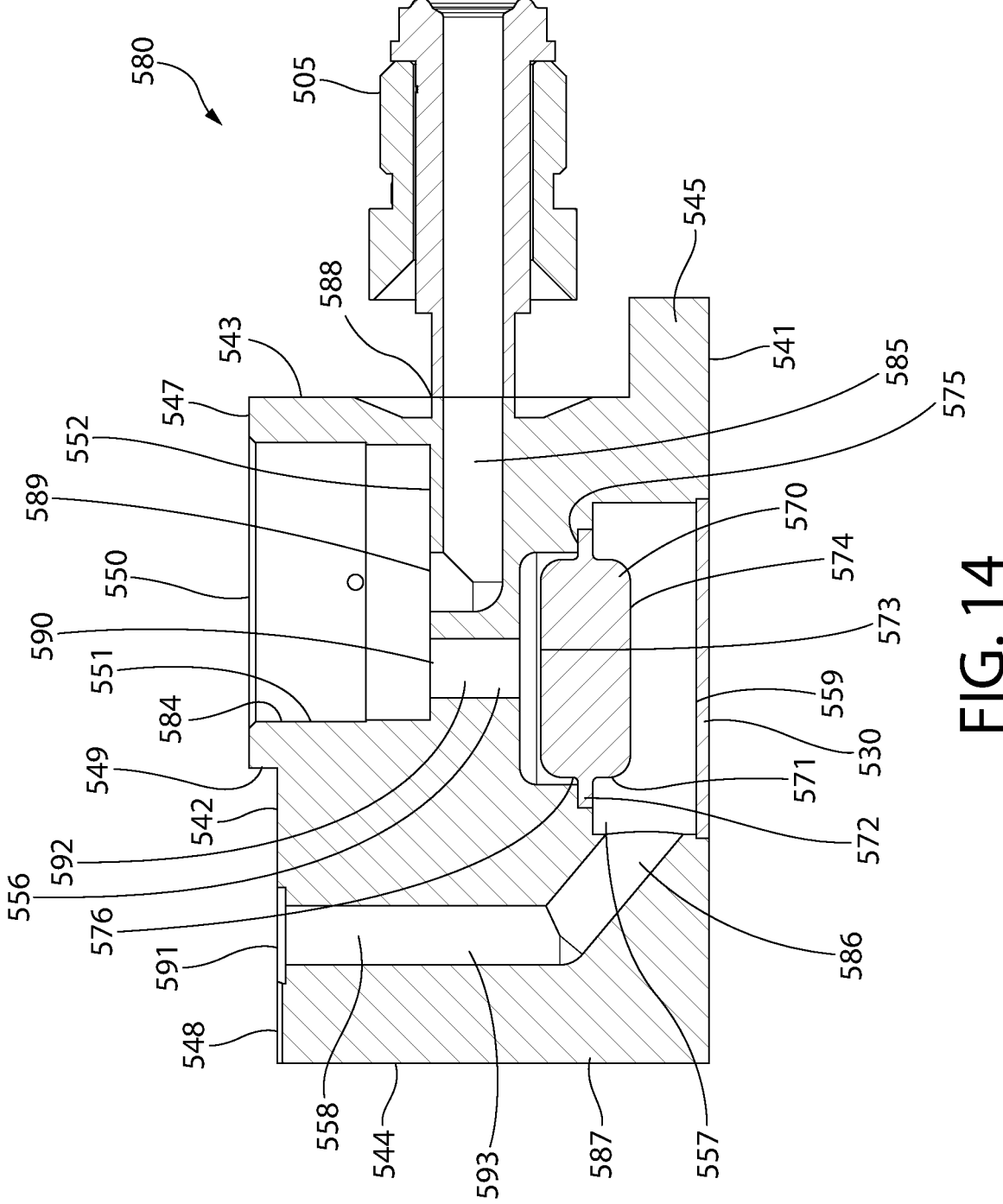
FIG. 14 is a cross-sectional view of the substrate block of FIG. 13 taken along the line XIV-XIV.

FIGS. 13 and 14 illustrate another alternate embodiment of a first substrate block 580. The first substrate block 580 comprises the inlet fitting 505. The inlet fitting 505 is identical to the inlet fitting 105, which is formed of two separate components as discussed above. The first substrate block 580 also comprises a monolithic body 587 and a filter media 570.

Turning to the monolithic body 587, the monolithic body has a bottom surface 541, a top surface 542, a first sidewall surface 543, and a second sidewall surface 544. The first inlet opening 588 is formed into the first sidewall surface 543. A flange portion 545 extends horizontally from a bottom of the first sidewall surface 543. A plurality of fasteners extend through the flange portion 545 to join the first substrate block 580 to the support structure 1402. The fasteners secure the bottom surface 541 of the monolithic body 587 to the top surface 1403 of the support structure 1402 and extend through fastener passageways 546 formed in the flange portion 545. Fasteners such as the fasteners 102 discussed above may be utilized. The fasteners 102 may be threaded or may be any other type of fastener suitable for attaching the first substrate block 580 to the support structure 1402.

The top surface 542 comprises a first section 547, and a second section 548. A component receiving port 584 is formed into the first section 547 while a second outlet opening 591 is formed into the second section 548. The first section 547 is vertically offset from the second section 548. The first section 547 is higher than the second section 548. An upstanding wall 549 is located between the first and second sections 547, 548 of the top surface 542. The first and second sections 547, 548 are substantially parallel.

The component receiving port 584 comprises a basin 550, the basin having a basin floor 552 and a collar portion 551 extending from the basin floor 552 to the first section 547 of the top surface 542. A first outlet opening 589 and a second inlet opening 590 are formed into the basin floor 552 of the component receiving port 584. The collar portion 551 forms at least a portion of the component receiving port 584 as noted above, the collar portion 551 being located between the basin floor 552 and the first section 547 of the top surface 542. A first fluid pathway 586 is formed between the first outlet opening 589 and the first inlet opening 588.

A second fluid pathway 586 comprises a pre-filter section 592 and a post-filter section 593 similar to the embodiments discussed above. The second fluid pathway 586 comprises a pre-filter passage 556, a filter chamber 557, and a post-filter passage 558. The pre-filter passage 556 extends from the second inlet opening 590 to the filter chamber 557. The post-filter passage 558 extends from the filter chamber 557 to the second outlet opening 591. The filter media 570 is positioned within the filter chamber 557.

The filter chamber 557 is bounded by a pocket formed into the bottom surface 541 of the monolithic body 587 and an end cap 530. The filter media 570 is positioned within the filter chamber 557. The filter media 570 comprises a generally disc-shaped filter body 571 and an annular flange 572 extending from the filter body 571. The filter body 571 extends from a top surface 573 to a bottom surface 574, fluid flowing through the filter media 570 from the top surface 573 to the bottom surface 574. Thus, the top surface 573 of the filter media defines a boundary of the pre-filter section 592 while the bottom surface 574 defines a boundary of the post-filter section 593. The filter media 570 divides the pre-filter section 592 and the post-filter section 593. The filter body 571 of the filter media 570 has a generally cylindrical profile, with radii transitioning between an outer diameter 576 and the top and bottom surfaces 573, 574. The annular flange 572 extends from the outer diameter 576 of the filter body 571. The radii may be of a variety of sizes, and the outer diameter 576 may be omitted, with the radii transitioning directly into the annular flange 572.

The filter media 570 may be porous, woven, or otherwise have open passages which allow fluid flow therethrough. The annular flange 572 is preferably formed of the same material as the rest of the filter media 570. In other words, the filter media 570 is an integrally formed, monolithic, component. The annular flange 572 may be pressed or welded into a recess 575 formed into the filter chamber 557. This allows the filter media 570 to seal against the monolithic body 587 without the need for additional seals to ensure that all fluid flows through the filter media 570. The end cap 530 forms a bottom wall 559 of the filter chamber 557. The end cap 530 is secured to the monolithic body 587 by welding, gluing, brazing, a threaded or press-fit connection, or any other known means suitable to provide a fluid-tight seal. The end cap 530 encloses the filter chamber 557 so that it is isolated from the ambient environment. Thus, no additional seals are required in order to couple the filter media 570 and the end cap 530 to the monolithic body

587 and ensure that no fluid bypasses the filter media 570 or escapes from the monolithic body 587 proximate the end cap 530.

Figure 15:
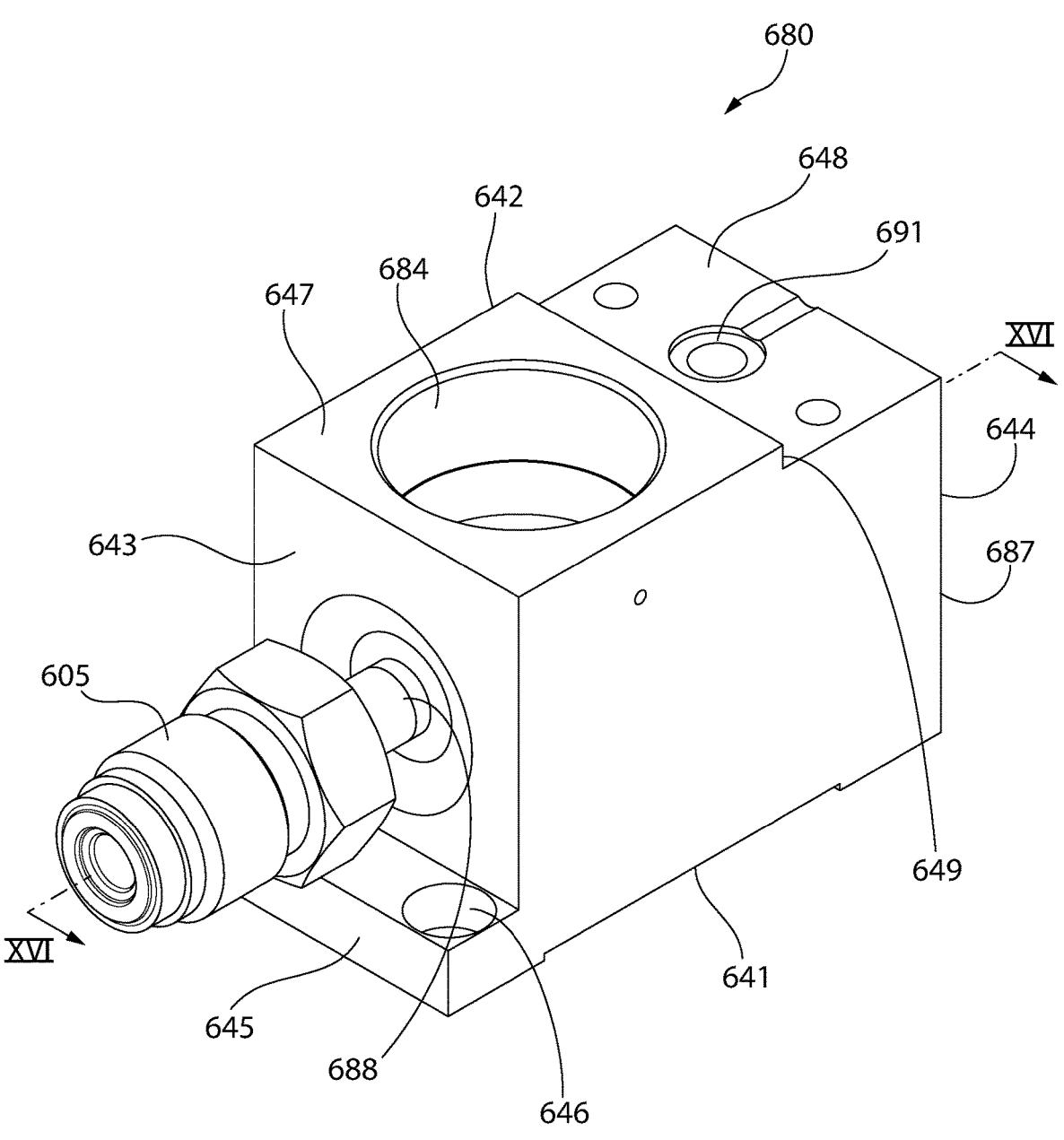
FIG. 15 is a perspective view of another embodiment of a substrate block as may be utilized in an active fluid flow component.
Figure 16:
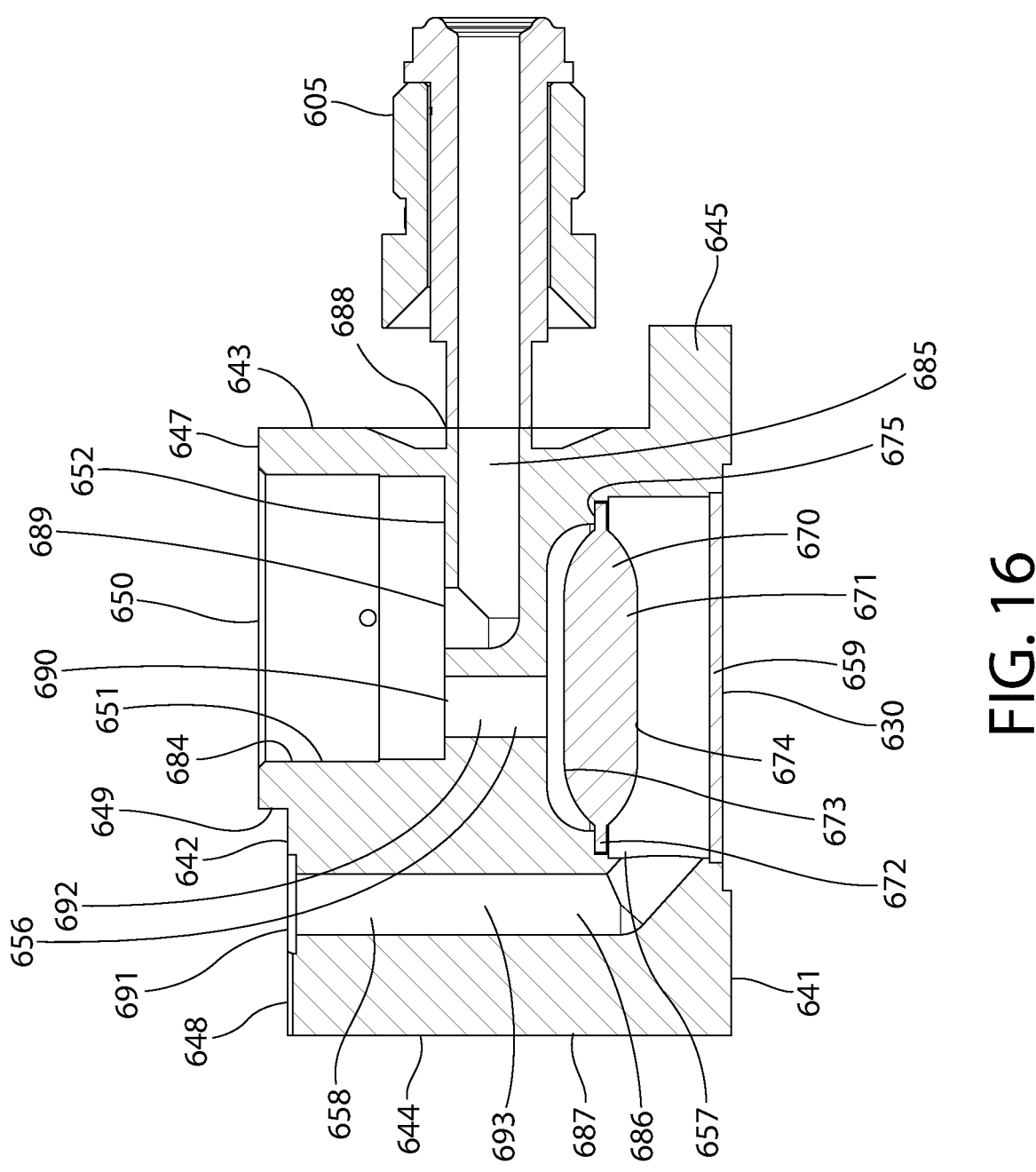
FIG. 16 is a cross-sectional view of the substrate block of FIG. 15 taken along the line XVI-XVI.

FIGS. 15 and 16 illustrate another alternate embodiment of a first substrate block 680. The first substrate block 680 comprises the inlet fitting 605. The inlet fitting 605 is identical to the inlet fitting 105, which is formed of two separate components as discussed above. The first substrate block 680 also comprises a monolithic body 687 and a filter media 670.

Turning to the monolithic body 687, the monolithic body has a bottom surface 641, a top surface 642, a first sidewall surface 643, and a second sidewall surface 644. The first inlet opening 688 is formed into the first sidewall surface 643. A flange portion 645 extends horizontally from a bottom of the first sidewall surface 643. A plurality of fasteners extend through the flange portion 645 to join the first substrate block 680 to the support structure 1402. The fasteners secure the bottom surface 641 of the monolithic body 687 to the top surface 1403 of the support structure 1402 and extend through fastener passageways 646 formed in the flange portion 645. Fasteners such as the fasteners 102 discussed above may be utilized. The fasteners 102 may be threaded or may be any other type of fastener suitable for attaching the first substrate block 680 to the support structure 1402.

The top surface 642 comprises a first section 647, and a second section 648. A component receiving port 684 is formed into the first section 647 while a second outlet opening 691 is formed into the second section 648. The first section 647 is vertically offset from the second section 648. The first section 647 is higher than the second section 648. An upstanding wall 649 is located between the first and second sections 647, 648 of the top surface 642. The first and second sections 647, 648 are substantially parallel.

The component receiving port 684 comprises a basin 650, the basin having a basin floor 652 and a collar portion 651 extending from the basin floor 652 to the first section 647 of the top surface 642. A first outlet opening 689 and a second inlet opening 690 are formed into the basin floor 652 of the component receiving port 684. The collar portion 651 forms at least a portion of the component receiving port 684 as noted above, the collar portion 651 being located between the basin floor 652 and the first section 647 of the top surface 642. A first fluid pathway 686 is formed between the first outlet opening 689 and the first inlet opening 688.

A second fluid pathway 686 comprises a pre-filter section 692 and a post-filter section 693 similar to the embodiments discussed above. The second fluid pathway 686 comprises a pre-filter passage 656, a filter chamber 657, and a post-filter passage 658. The pre-filter passage 656 extends from the second inlet opening 690 to the filter chamber 657. The post-filter passage 658 extends from the filter chamber 657 to the second outlet opening 691. The filter media 670 is positioned within the filter chamber 657.

The filter chamber 657 is bounded by a pocket formed into the bottom surface 641 of the monolithic body 687 and an end cap 630. The filter media 670 is positioned within the filter chamber 657. The filter media 670 comprises a generally disc-shaped filter body 671 and an annular flange 672 extending from the filter body 671. The filter body 671 extends from a top surface 673 to a bottom surface 674, fluid flowing through the filter media 670 from the top surface 673 to the bottom surface 674. Thus, the top surface 673 of the filter media defines a boundary of the pre-filter section 692 while the bottom surface 674 defines a boundary of the post-filter section 693. The filter media 670 divides the pre-filter section 692 and the post-filter section 693. The filter body 671 of the filter media 670 has a generally cylindrical profile, with radii transitioning between the annular flange 672 and the top and bottom surfaces 673, 674. The annular flange 672 extends from the filter body 671, with no distinct outer surface due to the large radii used to transition between the annular flange 672 and the top and bottom surfaces 673, 674. The radii may be of a variety of sizes.

The filter media 670 may be porous, woven, or otherwise have open passages which allow fluid flow therethrough. The annular flange 672 is preferably formed of the same material as the rest of the filter media 670. In other words, the filter media 670 is an integrally formed, monolithic, component. The annular flange 672 may be pressed or welded into a recess 675 formed into the filter chamber 657. This allows the filter media 670 to seal against the monolithic body 687 without the need for additional seals to ensure that all fluid flows through the filter media 670. The end cap 630 forms a bottom wall 659 of the filter chamber 657. The end cap 630 is secured to the monolithic body 687 by welding, gluing, brazing, a threaded or press-fit connection, or any other known means suitable to provide a fluid-tight seal. The end cap 630 encloses the filter chamber 657 so that it is isolated from the ambient environment. Thus, no additional seals are required in order to couple the filter media 670 and the end cap 630 to the monolithic body 687 and ensure that no fluid bypasses the filter media 670 or escapes from the monolithic body 687 proximate the end cap 630.

Figure 17:
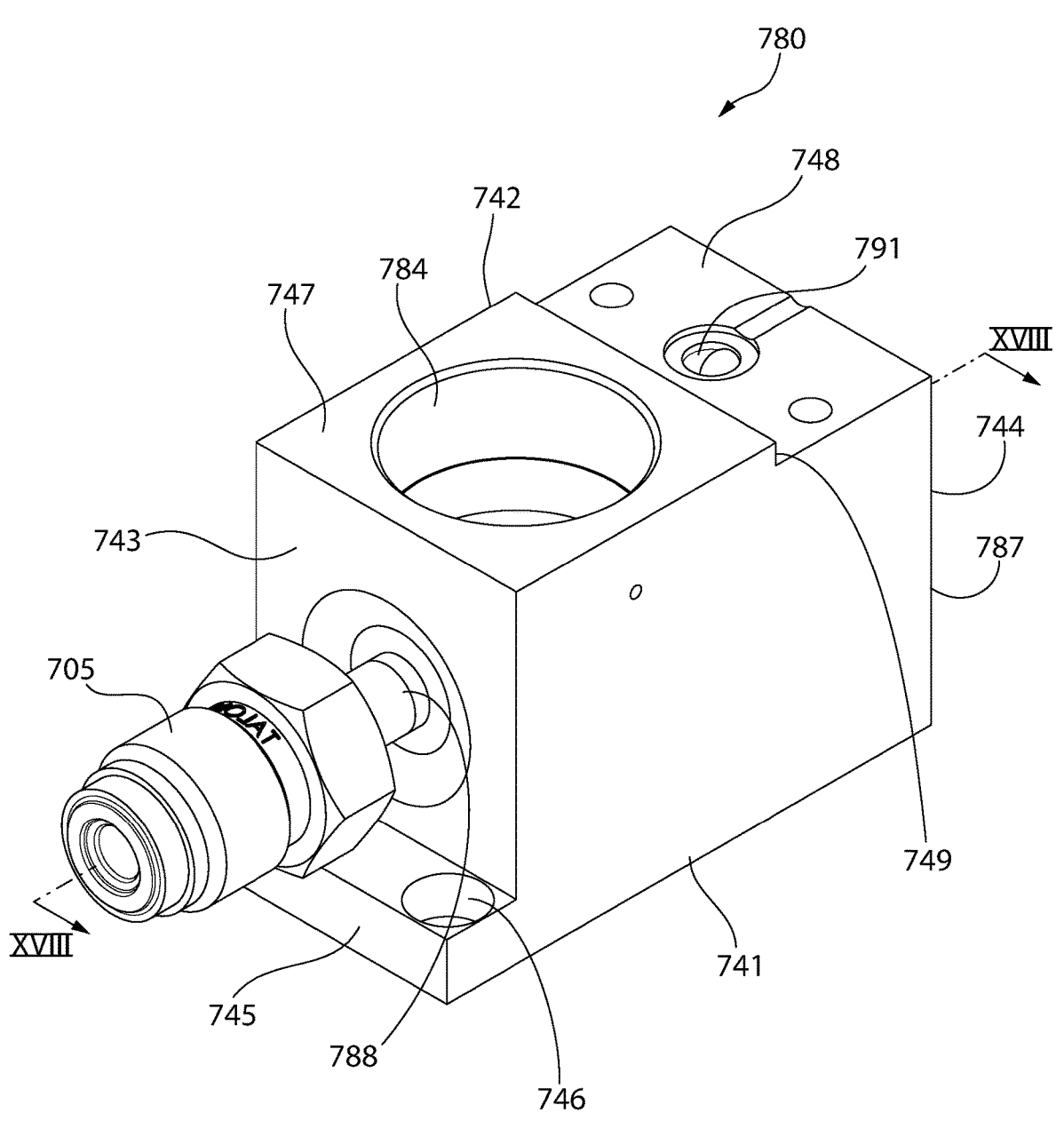
FIG. 17 is a perspective view of another embodiment of a substrate block as may be utilized in an active fluid flow component.
Figure 18:
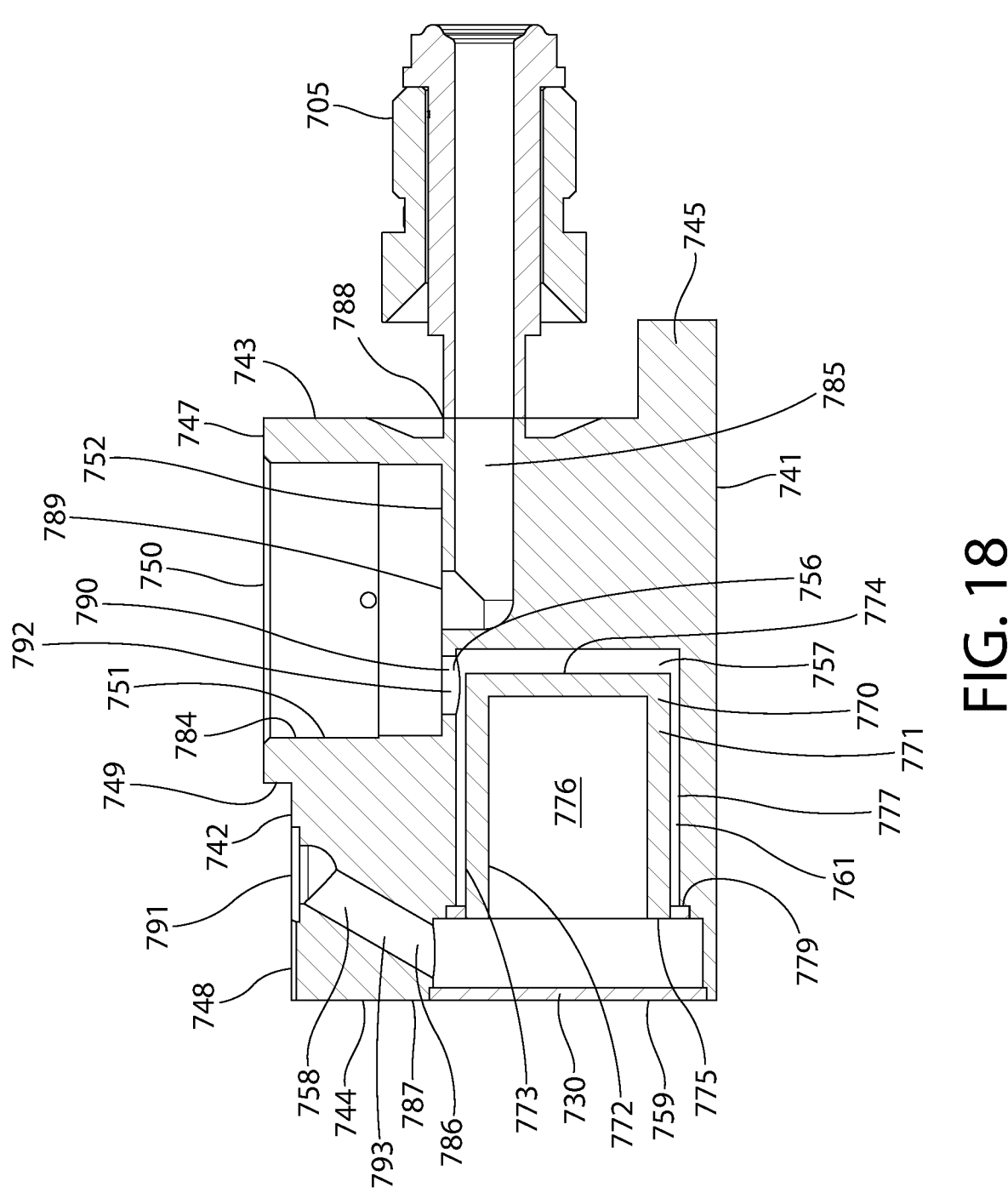
FIG. 18 is a cross-sectional view of the substrate block of FIG. 17 taken along the line XVIII-XVIII.

FIGS. 17 and 18 illustrate another alternate embodiment of a first substrate block 780. The first substrate block 780 comprises the inlet fitting 705. The inlet fitting 705 is identical to the inlet fitting 105, which is formed of two separate components as discussed above. The first substrate block 780 also comprises a monolithic body 787 and a filter media 770.

Turning to the monolithic body 787, the monolithic body has a bottom surface 741, a top surface 742, a first sidewall surface 743, and a second sidewall surface 744. The first inlet opening 788 is formed into the first sidewall surface 743. A flange portion 745 extends horizontally from a bottom of the first sidewall surface 743. A plurality of fasteners extend through the flange portion 745 to join the first substrate block 780 to the support structure 1402. The fasteners secure the bottom surface 741 of the monolithic body 787 to the top surface 1403 of the support structure 1402 and extend through fastener passageways 746 formed in the flange portion 745. Fasteners such as the fasteners 102 discussed above may be utilized. The fasteners 102 may be threaded or may be any other type of fastener suitable for attaching the first substrate block 780 to the support structure 1402.

The top surface 742 comprises a first section 747, and a second section 748. A component receiving port 784 is formed into the first section 747 while a second outlet opening 791 is formed into the second section 748. The first section 747 is vertically offset from the second section 748. The first section 747 is higher than the second section 748. An upstanding wall 749 is located between the first and second sections 747, 748 of the top surface 742. The first and second sections 747, 748 are substantially parallel.

The component receiving port 784 comprises a basin 750, the basin having a basin floor 752 and a collar portion 751 extending from the basin floor 752 to the first section 747 of the top surface 742. A first outlet opening 789 and a second inlet opening 790 are formed into the basin floor 752 of the component receiving port 784. The collar portion 751 forms at least a portion of the component receiving port 784 as noted above, the collar portion 751 being located between the basin floor 752 and the first section 747 of the top surface 742. A first fluid pathway 786 is formed between the first outlet opening 789 and the first inlet opening 788.

A second fluid pathway 786 comprises a pre-filter section 792 and a post-filter section 793 similar to the embodiments discussed above. The second fluid pathway 786 comprises a pre-filter passage 756, a filter chamber 757, and a post-filter passage 758. The pre-filter passage 756 extends from the second inlet opening 790 to the filter chamber 757. The post-filter passage 758 extends from the filter chamber 757 to the second outlet opening 791. The filter media 770 is positioned within the filter chamber 757.

The filter chamber 757 is bounded by a pocket formed into the second sidewall surface 744 of the monolithic body 787 and an end cap 730. The filter media 770 is positioned within the filter chamber 757. The filter media 770 comprises a cup-shaped filter body 771, the filter body 771 having an inner surface 772, an outer surface 773, a closed bottom end 774, and a second edge 775. An annular flange 778 is formed at the second edge 775, the annular flange 778 forming a flange which extends beyond the filter body 771. The annular flange 778 engages a recess 775 formed into the filter chamber 757.

The inner surface 772 of the tubular body defines a central filter cavity 776. A pre-filter annulus 777 is formed between the outer surface 773 and an inner surface 761 of the filter chamber 757. Thus, the central filter cavity 776 forms a portion of the post-filter section 793 while the pre-filter annulus 777 forms a portion of the pre-filter section 792. The filter media 770 divides the pre-filter section 792 and the post-filter section 793.

The filter media 770 is supported within the filter chamber 757 so that the pre-filter annulus 777 is maintained. The pre-filter annulus 777 is spaced and isolated from the inner surface 761 so that fluid can pass through the pre-filter annulus 777, the filter media 770, and then the post-filter passage 758. The post-filter passage 758 is in fluid communication with the central filter cavity 776 while the pre-filter annulus 777 is in fluid communication with the pre-filter passage 756.

The filter media 770 may be porous, woven, or otherwise have open passages which allow fluid flow therethrough. The annular flange 778 is preferably formed of the same material as the rest of the filter media 770. In other words, the filter media 770 is an integrally formed, monolithic, component. The annular flange 772 may be pressed or welded into the recess 779 formed into the filter chamber 757. This allows the filter media 770 to seal against the monolithic body 787 without the need for additional seals to ensure that all fluid flows through the filter media 770. The end cap 730 forms an end wall 759 of the filter chamber 757. The end cap 730 is secured to the monolithic body 787 by welding, gluing, brazing, a threaded or press-fit connection, or any other known means suitable to provide a fluid-tight seal. The end cap 730 encloses the filter chamber 757 so that it is isolated from the ambient environment. Thus, no additional seals are required in order to couple the filter media 770 and the end cap 730 to the monolithic body 787 and ensure that no fluid bypasses the filter media 770 or escapes from the monolithic body 787 proximate the end cap 730.

Figure 19:
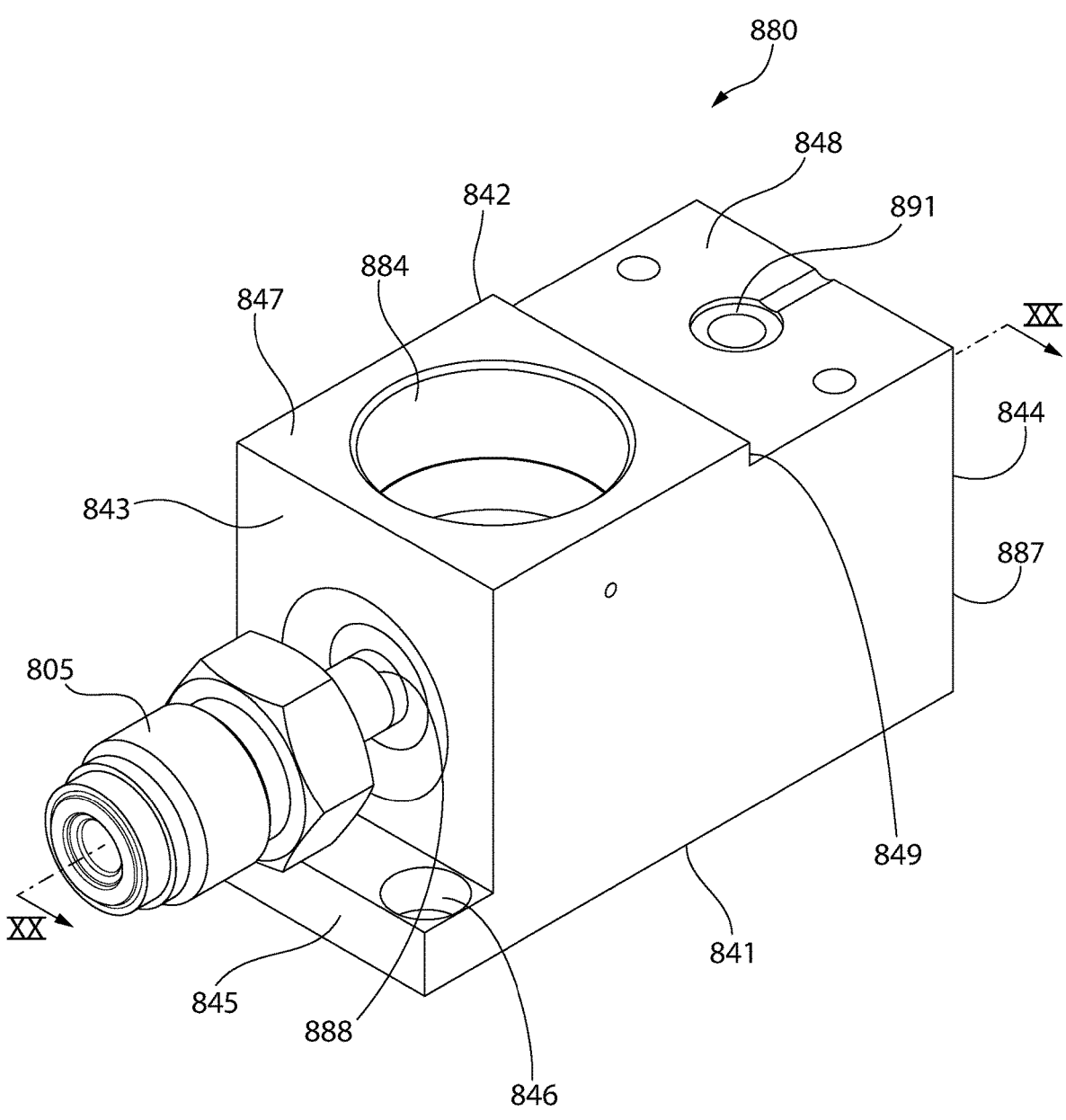
FIG. 19 is a perspective view of another embodiment of a substrate block as may be utilized in an active fluid flow component.
Figure 20:
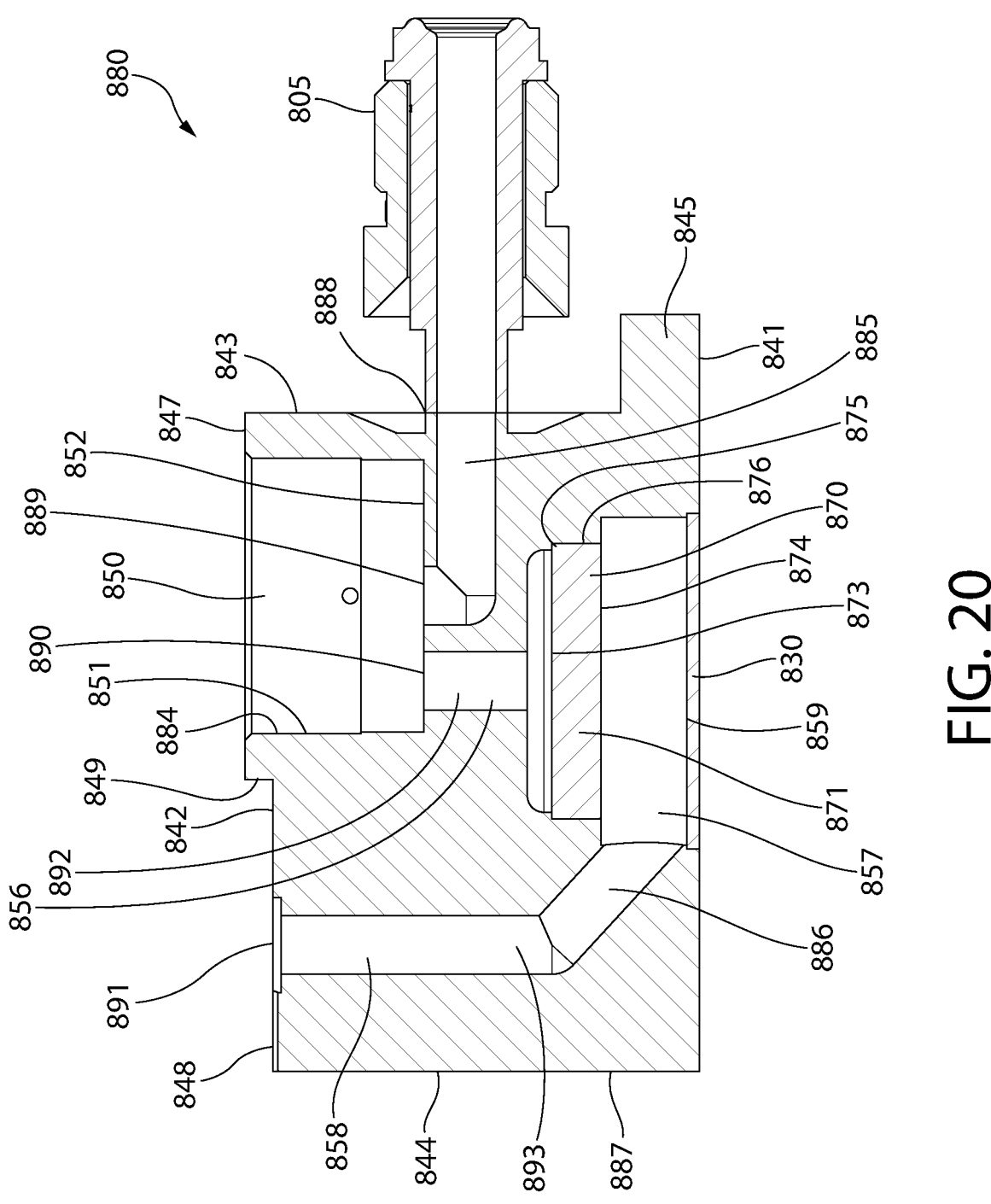
FIG. 20 is a cross-sectional view of the substrate block of FIG. 19 taken along the line XX-XX.

FIGS. 19 and 20 illustrate another alternate embodiment of a first substrate block 880. The first substrate block 880 comprises the inlet fitting 805. The inlet fitting 805 is identical to the inlet fitting 105, which is formed of two separate components as discussed above. The first substrate block 880 also comprises a monolithic body 887 and a filter media 870.

Turning to the monolithic body 887, the monolithic body has a bottom surface 841, a top surface 842, a first sidewall surface 843, and a second sidewall surface 844. The first inlet opening 888 is formed into the first sidewall surface 843. A flange portion 845 extends horizontally from a bottom of the first sidewall surface 843. A plurality of fasteners extend through the flange portion 845 to join the first substrate block 880 to the support structure 1402. The fasteners secure the bottom surface 841 of the monolithic body 887 to the top surface 1403 of the support structure 1402 and extend through fastener passageways 846 formed in the flange portion 845. Fasteners such as the fasteners 102 discussed above may be utilized. The fasteners 102 may be threaded or may be any other type of fastener suitable for attaching the first substrate block 880 to the support structure 1402.

The top surface 842 comprises a first section 847, and a second section 848. A component receiving port 884 is formed into the first section 847 while a second outlet opening 891 is formed into the second section 848. The first section 847 is vertically offset from the second section 848. The first section 847 is higher than the second section 848. An upstanding wall 849 is located between the first and second sections 847, 848 of the top surface 842. The first and second sections 847, 848 are substantially parallel.

The component receiving port 884 comprises a basin 850, the basin having a basin floor 852 and a collar portion 851 extending from the basin floor 852 to the first section 847 of the top surface 842. A first outlet opening 889 and a second inlet opening 890 are formed into the basin floor 852 of the component receiving port 884. The collar portion 851 forms at least a portion of the component receiving port 884 as noted above, the collar portion 851 being located between the basin floor 852 and the first section 847 of the top surface 842. A first fluid pathway 886 is formed between the first outlet opening 889 and the first inlet opening 888.

A second fluid pathway 886 comprises a pre-filter section 892 and a post-filter section 893 similar to the embodiments discussed above. The second fluid pathway 886 comprises a pre-filter passage 856, a filter chamber 857, and a post-filter passage 858. The pre-filter passage 856 extends from the second inlet opening 890 to the filter chamber 857. The post-filter passage 858 extends from the filter chamber 857 to the second outlet opening 891. The filter media 870 is positioned within the filter chamber 857.

The filter chamber 857 is bounded by a pocket formed into the bottom surface 841 of the monolithic body 887 and an end cap 830. The filter media 870 is positioned within filter chamber 857. The filter media 870 comprises a generally disc-shaped filter body 871. Unlike previous embodiments, there is no annular flange extending from the filter body 871. The filter body 871 extends from a top surface 873 to a bottom surface 874, fluid flowing through the filter media 870 from the top surface 873 to the bottom surface 874. Thus, the top surface 873 of the filter media defines a boundary of the pre-filter section 892 while the bottom surface 874 defines a boundary of the post-filter section 893. The filter media 870 divides the pre-filter section 892 and the post-filter section 893. The filter body 871 of the filter media 870 has a generally cylindrical profile. There are no radii transitioning between an outer diameter 876 and the top and bottom surfaces 873, 874. Instead, the outer diameter 876 forms sharp edges with the top and bottom surfaces 873, 874.

The filter media 870 may be porous, woven, or otherwise have open passages which allow fluid flow therethrough. The filter media 870 is an integrally formed, monolithic, component. The filter body 871 may be pressed or welded into a recess 875 formed into the filter chamber 857. This allows the filter media 870 to seal against the monolithic body 887 without the need for additional seals to ensure that all fluid flows through the filter media 870. The end cap 830 forms a bottom wall 859 of the filter chamber 857. The end cap 830 is secured to the monolithic body 887 by welding, gluing, brazing, a threaded or press-fit connection, or any other known means suitable to provide a fluid-tight seal. The end cap 830 encloses the filter chamber 857 so that it is isolated from the ambient environment. Thus, no additional seals are required in order to couple the filter media 870 and the end cap 830 to the monolithic body 887 and ensure that no fluid bypasses the filter media 870 or escapes from the monolithic body 887 proximate the end cap 830.

In yet other configurations, the first substrate blocks discussed above may incorporate other known filter arrangements, and they need not be installed via the second sidewall surface or the bottom surface of the monolithic body. Instead, the filter chamber may be formed into one of the lateral surfaces of the first substrate blocks as desired. In yet other embodiments, the filter chamber may be formed into more than one surface. The exact arrangement of the filter media and the filter chamber may vary depending on application requirements.

While the invention has been described with respect to specific examples including presently preferred modes of carrying out the invention, those skilled in the art will appreciate that there are numerous variations and permutations of the above-described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A fluid delivery module, comprising:
   a support structure;
   a substrate block mounted to the support structure, the substrate block comprising:
      a monolithic body:
      a component receiving port formed in the monolithic body;
      a first fluid pathway formed in the monolithic body and extending from a first inlet opening to a first outlet opening at the component receiving port; and
      a second fluid pathway formed in the monolithic body and extending from a second inlet opening at the component receiving port to a second outlet opening;
   a filter media positioned within the second fluid pathway that divides the second fluid pathway into a pre-filter section and a post-filter section; and
   an active flow component mounted on the monolithic body of the substrate block at the component receiving port and fluidly coupled to each of the first outlet opening and the second inlet opening.

2. The fluid delivery module according to claim 1 wherein a bottom surface of monolithic body of the substrate block is adjacent to and in contact with the top surface of the support structure.

3. The fluid delivery module according to claim 1 wherein the monolithic body comprises a top surface, the component receiving port and the second outlet opening formed in the top surface.

4. The fluid delivery module according to claim 3 wherein the top surface comprises a first section and a second section vertically offset from but substantially parallel to the first section, the component receiving port located in the first section of the top surface and the second outlet opening located in the second section of the top surface, and further comprising an upstanding wall extending between the first and second sections of the top surface.

5. The fluid delivery module according to claim 1 wherein the component receiving port comprises a basin formed in the monolithic body and having a basin floor, each of the first outlet opening and the second inlet opening located on the basin floor.

6. The fluid delivery module according to claim 1 wherein the monolithic body comprises a collar portion that forms at least a portion of the component receiving port.

7. The fluid delivery module according to claim 1 wherein the first inlet opening is located on a first sidewall surface of the monolithic body, and further comprising:

the monolithic body comprising a flange portion protruding horizontally from a bottom of the first sidewall surface; and one or more fasteners extending through the flange portion and engaging the support structure to secure the substrate block to the support structure.

8. The fluid delivery module according to claim 1 wherein the second fluid pathway comprises a pre-filter passage, a filter chamber, and post-filter passage; and wherein the pre-filter passage extends from the second inlet opening to the filter chamber, the post-filter passage extends from the filter chamber to the second outlet opening, and the filter media positioned within the filter chamber.

9. The fluid delivery module according to claim 8 wherein the filter media comprises a tubular filter body, an inner surface of the tubular filter body defining a central filter cavity, the filter media supported within the filter chamber to form a post-filter annulus about the outer surface of the tubular filter body; and wherein the pre-filter passage is in fluid communication with the central filter cavity and the post-filter passage is in fluid communication with the post-filter passage.

10. The fluid delivery module according to claim 8 further comprising:

a first annular gasket positioned within the filter chamber and forming a first seal between a first edge of the tubular filter body and a first end wall of the filter chamber; and a second gasket positioned within the filter chamber and forming a second seal between a second edge of the tubular filter body and a second end wall of the filter chamber.

11. The fluid delivery module according to claim 8 wherein the filter media comprises a filter body and an annular flange extending from the filter body.

12. The fluid delivery module according to claim 11 wherein the annular flange of the filter media engages a recess formed in the filter chamber.

13. The fluid delivery module according to claim 11 wherein the filter body is cylindrical, the annular flange extending from an outer diameter of the filter body.

14. The fluid delivery module according to claim 1 wherein the active flow component is mounted directly to the substrate block and supported solely by the substrate block.

15. The fluid delivery module according to claim 1 wherein the active flow component is a valve.

16. The fluid delivery module according to claim 15 wherein the active flow component is a lock out tag out valve.

17. The fluid delivery module according to claim 1 wherein the component block protrudes horizontally beyond the substrate block and comprises an end portion mounted to the support structure.

18. A fluid delivery module, comprising:

a substrate block, comprising:

a monolithic body;

a component receiving port formed in the monolithic body;

a first fluid pathway formed in the monolithic body and extending from a first inlet opening to a first outlet opening at the component receiving port; and a second fluid pathway formed in the monolithic body and extending from a second inlet opening at the component receiving port to a second outlet opening;

a filter media positioned within the second fluid pathway divides the second fluid pathway into a pre-filter section and a post-filter section; and a active flow component mounted on the monolithic body of the substrate block at the component receiving port and fluidly coupled to each of the first outlet opening and the second inlet opening.

19. A system for processing semiconductor wafers, the system comprising:

a fluid source;

the fluid delivery module according to claim 1, the first inlet opening of the fluid delivery module fluidly coupled to the fluid source; and a process chamber fluidly coupled to the fluid delivery module to receive outgoing fluid from the fluid delivery module.

20. The fluid delivery module of claim 1, wherein the monolithic body comprises a top side and a bottom side, wherein the component receiving port is defined in the top side of the monolithic body, and wherein the filter media is positioned below the component receiving port.

21. The fluid delivery module of claim 1, wherein the monolithic body comprises a top side and a bottom side, wherein the active flow component is mounted to the top side of the monolithic body, and wherein the filter media is positioned below the active flow component.

* * * * *